(12) United States Patent
Watanabe

(10) Patent No.: US 11,688,705 B2
(45) Date of Patent: Jun. 27, 2023

(54) SEMICONDUCTOR DEVICE AND METHOD OF MANUFACTURING THE SAME

(71) Applicant: Kioxia Corporation, Tokyo (JP)

(72) Inventor: Takashi Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 84 days.

(21) Appl. No.: 17/366,262

(22) Filed: Jul. 2, 2021

(65) Prior Publication Data

US 2022/0270993 A1 Aug. 25, 2022

(30) Foreign Application Priority Data

Feb. 25, 2021 (JP) ................. 2021-029074

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC .............. *H01L 24/08* (2013.01); *H01L 24/06* (2013.01); *H01L 24/09* (2013.01); *H01L 24/80* (2013.01); *H01L 2224/0603* (2013.01); *H01L 2224/0612* (2013.01); *H01L 2224/0613* (2013.01); *H01L 2224/08147* (2013.01); *H01L 2224/0903* (2013.01); *H01L 2224/80895* (2013.01); *H01L 2224/80896* (2013.01)

(58) Field of Classification Search
CPC combination set(s) only.
See application file for complete search history.

(56) References Cited

U.S. PATENT DOCUMENTS

| 8,368,222 | B2 | 2/2013 | Okuyama | |
|---|---|---|---|---|
| 9,230,941 | B2 | 1/2016 | Chen et al. | |
| 9,343,498 | B2 * | 5/2016 | Saito | H01L 24/92 |
| 9,799,587 | B2 * | 10/2017 | Fujii | H01L 27/1464 |
| 10,431,621 | B2 | 10/2019 | Kagawa et al. | |
| 2011/0042814 | A1 * | 2/2011 | Okuyama | H01L 27/14636 438/455 |
| 2015/0279888 | A1 * | 10/2015 | Chen | H01L 27/14634 257/459 |

(Continued)

FOREIGN PATENT DOCUMENTS

| JP | 2011-044655 A | 3/2011 |
|---|---|---|
| JP | 2012-244101 A | 12/2012 |
| JP | 2012-256736 A | 12/2012 |

*Primary Examiner* — Niki H Nguyen
(74) *Attorney, Agent, or Firm* — Oblon, McClelland, Maier & Neustadt, L.L.P.

(57) ABSTRACT

In one embodiment, a semiconductor device includes a lower interconnect layer including a plurality of lower interconnects, and a plurality of lower pads provided on the lower interconnects. The device further includes a plurality of upper pads provided on the lower pads and being in contact with the lower pads, and an upper interconnect layer including a plurality of upper interconnects provided on the upper pads. The lower pads include a plurality of first pads and a plurality of second pads. The upper pads include a plurality of third pads provided on the second pads and a plurality of fourth pads provided on the first pads, a lower face of each third pad is larger in area than a upper face of each second pad, and a lower face of each fourth pad is smaller in area than a upper face of each first pad.

20 Claims, 15 Drawing Sheets

(56) References Cited

U.S. PATENT DOCUMENTS

| | | | |
|---|---|---|---|
| 2018/0033773 A1* | 2/2018 | Huang | H01L 25/0657 |
| 2018/0138223 A1* | 5/2018 | Kotoo | H01L 25/07 |
| 2018/0219038 A1* | 8/2018 | Gambino | H01L 27/14618 |
| 2019/0096842 A1 | 3/2019 | Fountain, Jr. et al. | |
| 2021/0296269 A1* | 9/2021 | Sharangpani | H01L 24/06 |
| 2021/0320075 A1* | 10/2021 | Hou | H01L 25/0657 |

* cited by examiner

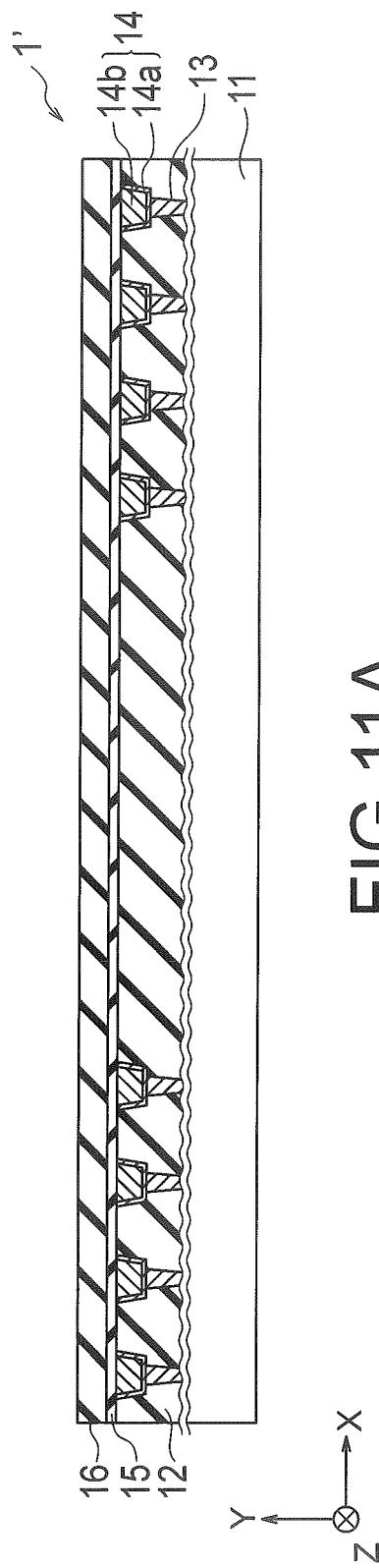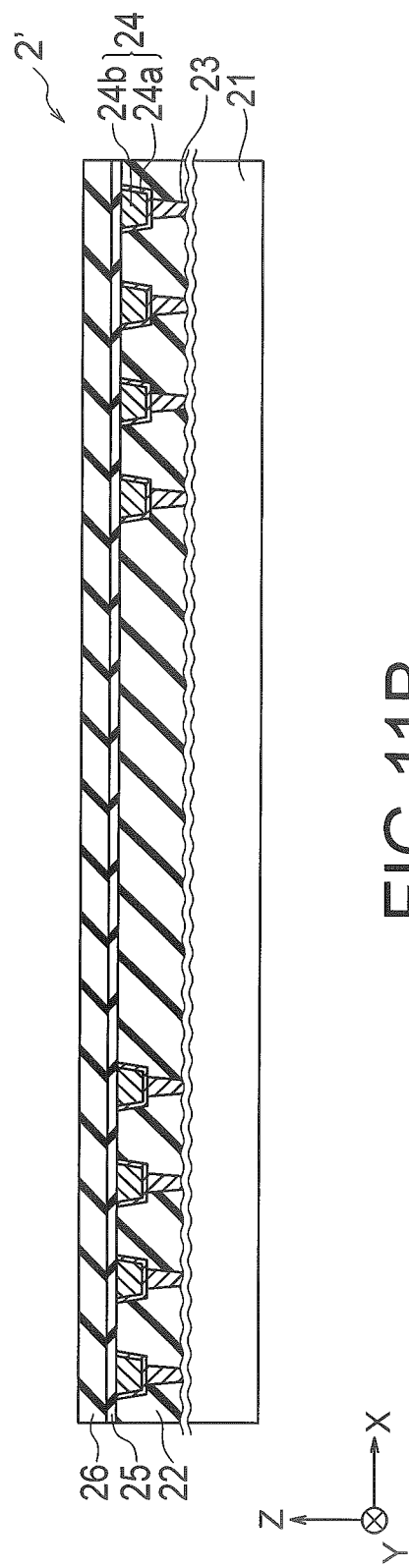

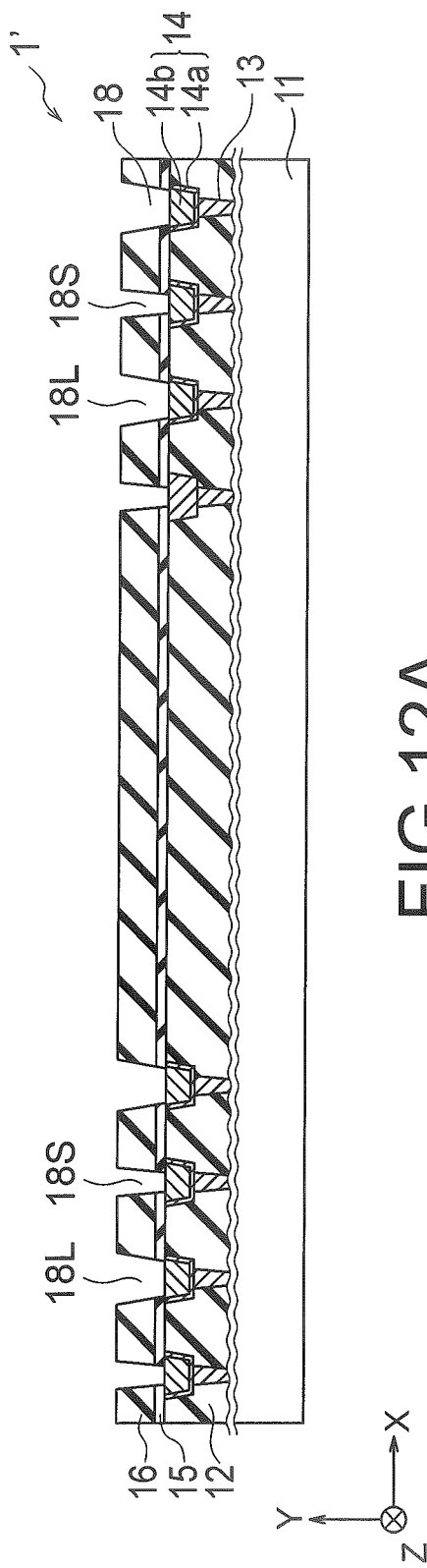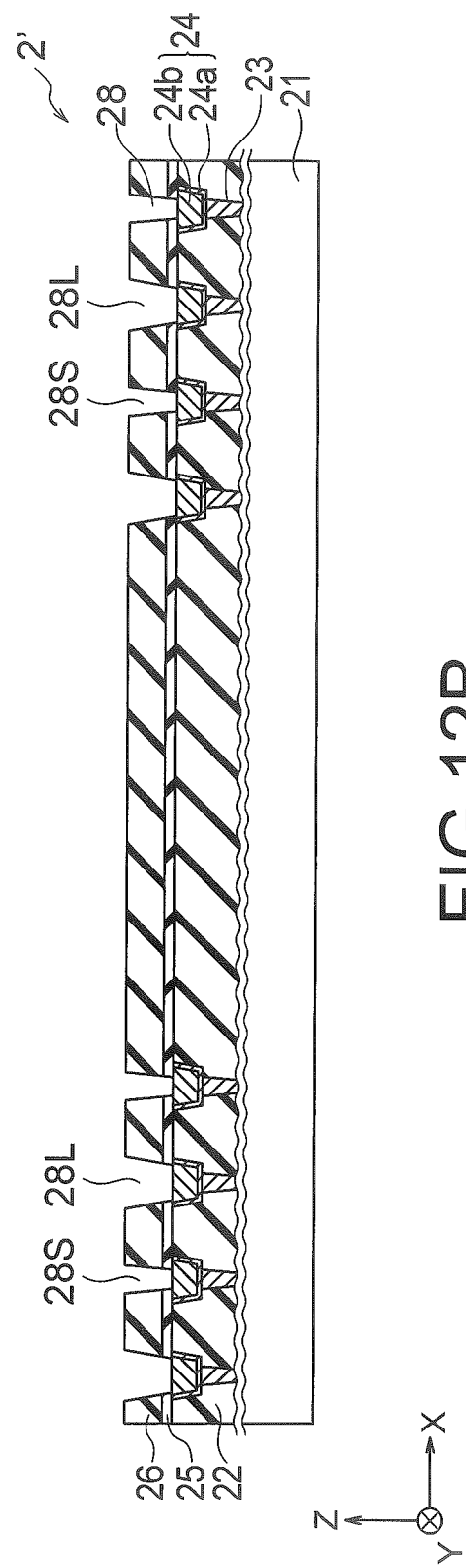
FIG.12A
FIG.12B

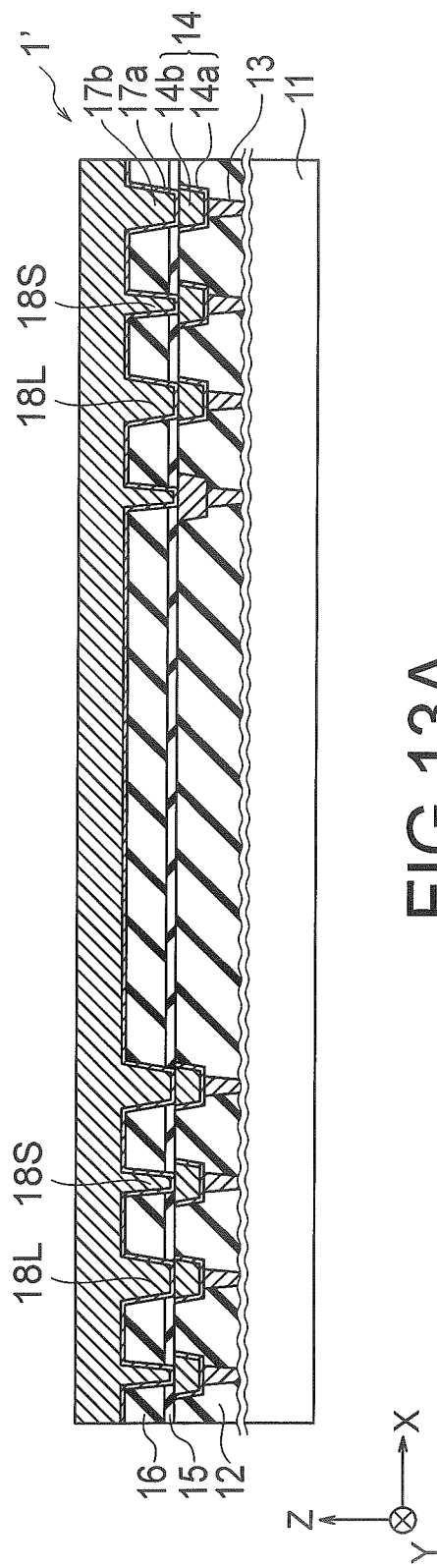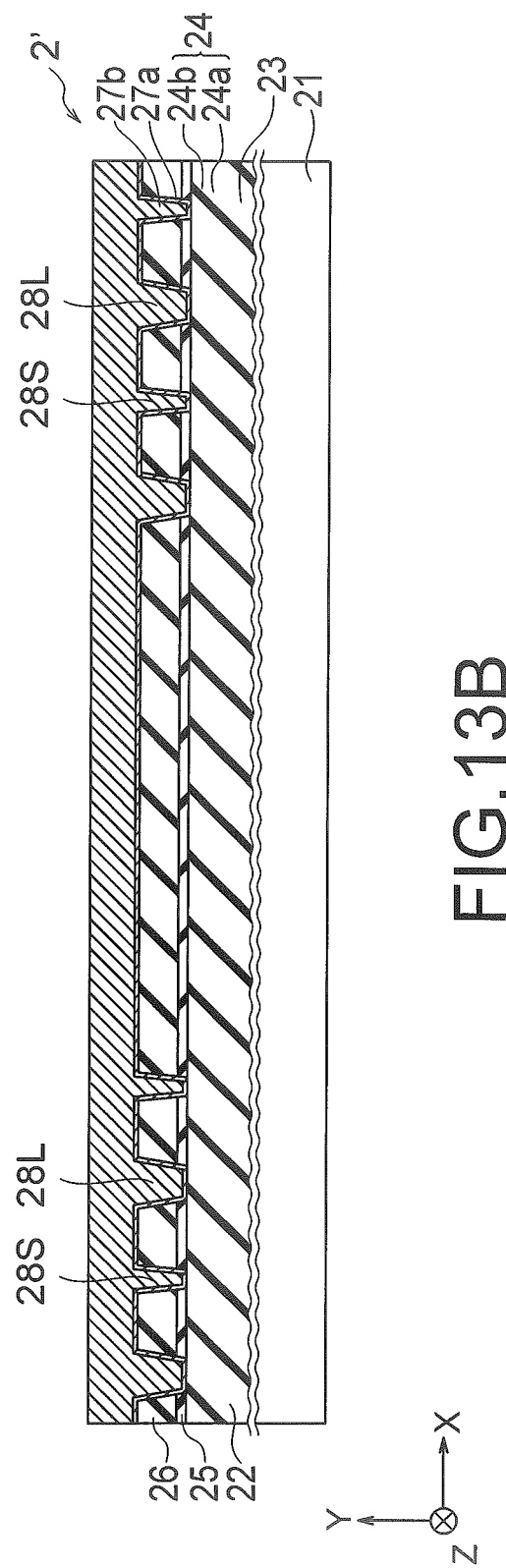

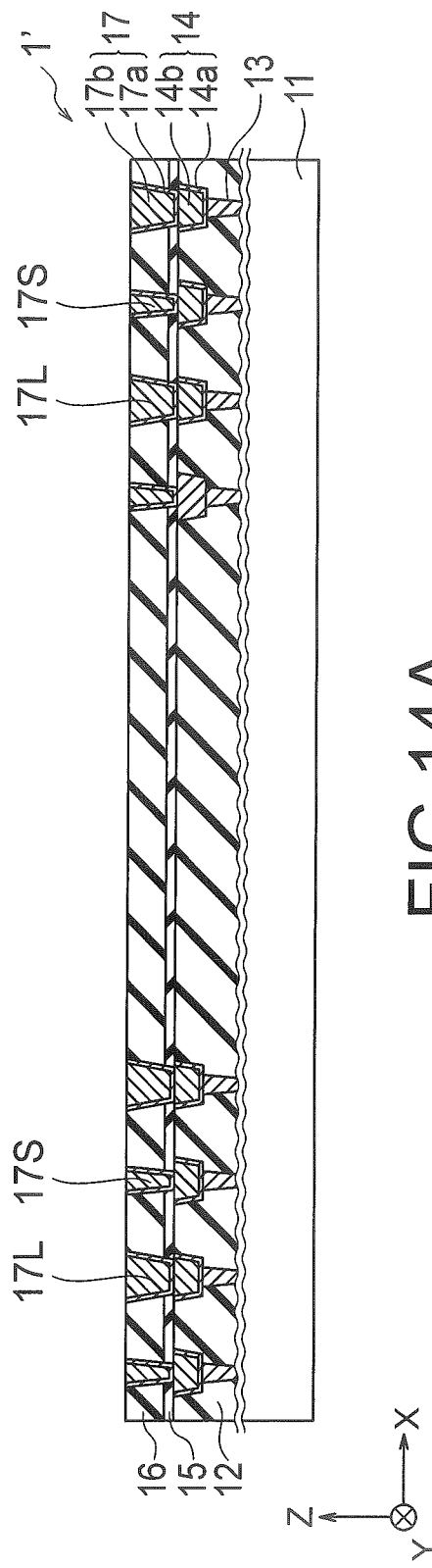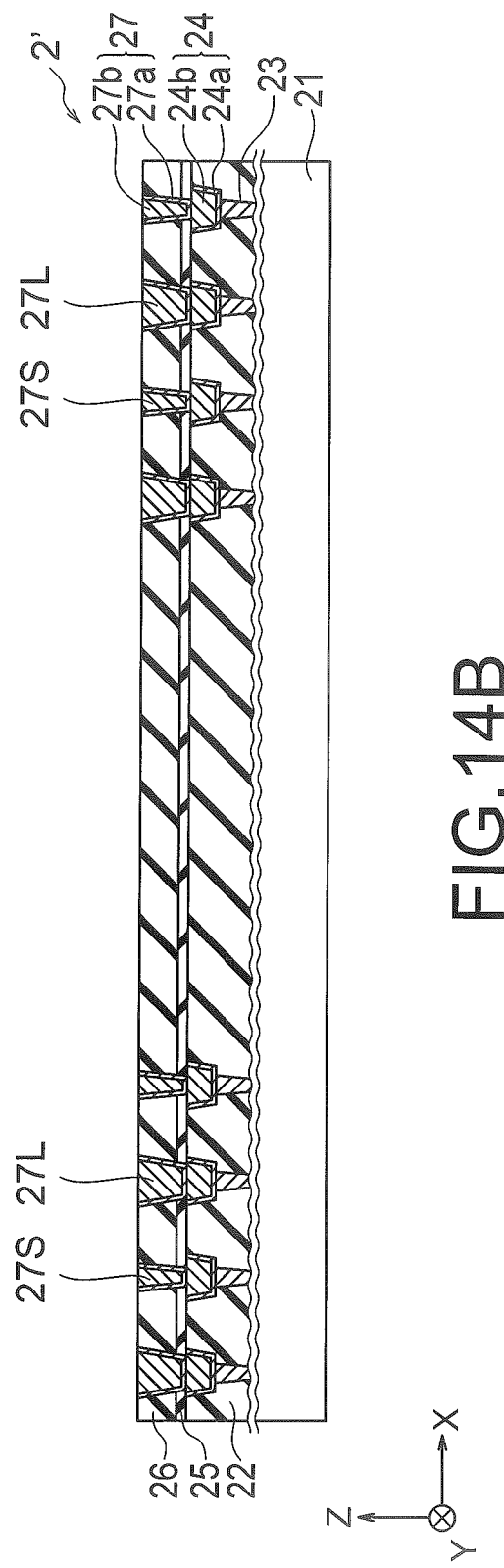

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2021-029074, filed on Feb. 25, 2021, the entire contents of which are incorporated herein by reference.

FIELD

Embodiments described herein relate to a semiconductor device and a method of manufacturing the same.

BACKGROUND

When a semiconductor device is manufactured by bonding a metal pad in a wafer and a metal pad in another wafer, these metal pads may adversely affect surrounding inter layer dielectrics.

BRIEF DESCRIPTION OF THE DRAWINGS

FIGS. 11A to 15 are cross-sectional views showing a method of manufacturing a semiconductor device of a second embodiment.

DETAILED DESCRIPTION

Figure 1:
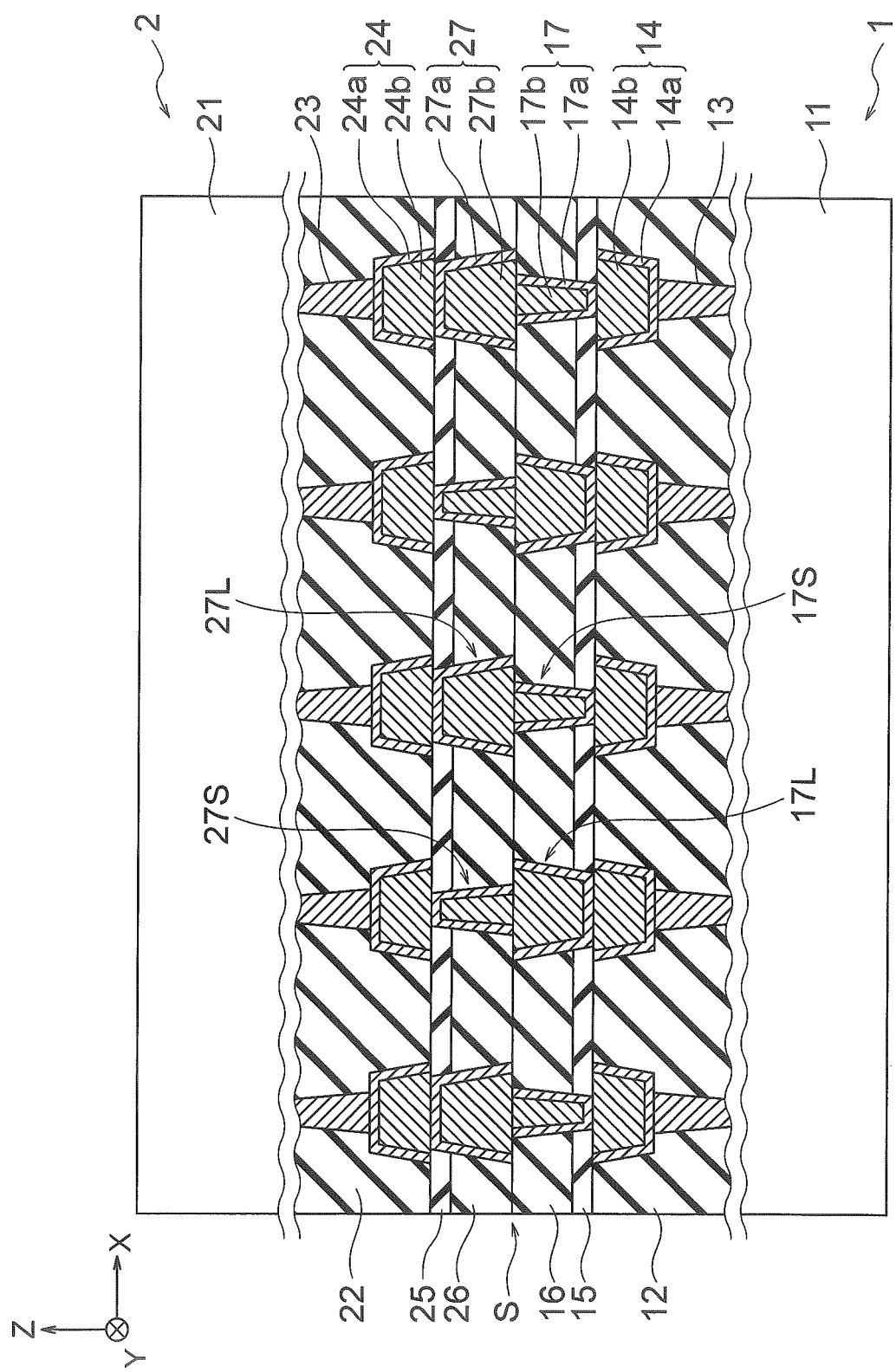
FIG. 1 is a cross-sectional view showing a structure of a semiconductor device of a first embodiment.

Embodiments will now be explained with reference to the accompanying drawings. In FIGS. 1 to 15, the same components are denoted by the same reference numerals, and overlapping descriptions will be omitted.

In one embodiment, a semiconductor device includes a lower interconnect layer including a plurality of lower interconnects, and a plurality of lower pads provided on the lower interconnects. The device further includes a plurality of upper pads provided on the lower pads and being in contact with the lower pads, and an upper interconnect layer including a plurality of upper interconnects provided on the upper pads. The lower pads include a plurality of first pads and a plurality of second pads. The upper pads include a plurality of third pads provided on the second pads and a plurality of fourth pads provided on the first pads, a lower face of each third pad is larger in area than a upper face of each second pad, and a lower face of each fourth pad is smaller in area than a upper face of each first pad.

First Embodiment

FIG. 1 is a cross-sectional view showing a structure of a semiconductor device of a first embodiment.

The semiconductor device of the present embodiment includes a lower substrate 1 and an upper substrate 2 provided on the lower substrate 1. The semiconductor device of the present embodiment is manufactured by bonding the lower substrate 1 and the upper substrate 2, for example. FIG. 1 shows a bonding face (boundary face) S between the lower substrate 1 and the upper substrate 2. Examples of the semiconductor device of the present embodiment include a three-dimensional memory and an image sensor.

FIG. 1 shows an X direction, a Y direction, and a Z direction perpendicular to each other. In this specification, the +Z direction is treated as the upper direction, and the −Z direction is treated as the lower direction. The −Z direction may or may not be identical to the direction of gravitational force.

The lower substrate 1 includes a semiconductor substrate 11, an inter layer dielectric 12, a plurality of via plugs 13, an interconnect layer 14, an insulator 15, an inter layer dielectric 16, and a plurality of metal pads 17. Each of interconnects in the interconnect layer 14 includes a barrier metal layer 14a and an interconnect material layer 14b. Each of the metal pads 17 includes a barrier metal layer 17a and a pad material layer 17b. The interconnect layer 14 is an example of a lower interconnect layer, the respective interconnects in the interconnect layer 14 are an example of lower interconnects, and the respective metal pads 17 are an example of lower pads. FIG. 1 shows the five via plugs 13, five interconnects in the interconnect layer 14, and the five metal pads 17, as an example.

The upper substrate 2 includes a semiconductor substrate 21, an inter layer dielectric 22, a plurality of via plugs 23, an interconnect layer 24, an insulator 25, an inter layer dielectric 26, and a plurality of metal pads 27. Each of interconnects in the interconnect layer 24 includes a barrier metal layer 24a and an interconnect material layer 24b. Each of the metal pads 27 includes a barrier metal layer 27a and a pad material layer 27b. The interconnect layer 24 is an example of an upper interconnect layer, the respective interconnects in the interconnect layer 24 are an example of upper interconnects, and the respective metal pads 27 are an example of upper pads. FIG. 1 shows the five via plugs 23, five interconnects in the interconnect layer 24, and the five metal pads 27, as an example. The upper substrate 2 may not include the semiconductor substrate 21.

An example of the semiconductor substrate 11 is a silicon substrate. The inter layer dielectric 12 is formed above the semiconductor substrate 11. The via plugs 13 are formed in the inter layer dielectric 12 above the semiconductor substrate 11. The interconnect layer 14 is formed on the via plugs 13 in the inter layer dielectric 12. In FIG. 1, the five interconnects in the interconnect layer 14 are respectively arranged on the five via plugs 13, and are in contact with these via plugs 13. An example of the interconnect material layer 14b is an Al (aluminum) layer, a W (tungsten) layer, or a Cu (copper) layer.

The insulator 15 is formed on the inter layer dielectric 12 and the interconnect layer 14. The inter layer dielectric 16 is formed on the insulator 15. The metal pads 17 are formed on the interconnect layer 14 in the insulator 15 and the inter layer dielectric 16. In FIG. 1, the five metal pads 17 are respectively arranged on the five interconnects in the interconnect layer 14, and are in contact with these interconnects. An example of the pad material layer 17b is a Cu layer. The upper faces of the metal pads 17 and the upper face of the inter layer dielectric 16 form the bonding face S. The insulator 15 is used as an etch stopper when forming openings for the metal pads 17 in the inter layer dielectric 16 and the insulator 15.

The inter layer dielectric 26 is formed on the inter layer dielectric 16 and the metal pads 17. The insulator 25 is formed on the inter layer dielectric 26. The metal pads 27 are formed on the metal pads 17 in the inter layer dielectric 26 and the insulator 25. In FIG. 1, the five metal pads 27 are respectively arranged on the five metal pads 17, and are in contact with these metal pads 17. As a result, the upper substrate 2 is electrically connected to the lower substrate 1. An example of the pad material layer 27b is a Cu layer. The lower faces of the metal pads 27 and the lower face of the inter layer dielectric 26 form the bonding face S. The insulator 25 is used as an etch stopper when forming openings for the metal pads 27 in the inter layer dielectric 26 and the insulator 25.

The inter layer dielectric 22 is formed on the insulator 25. The interconnect layer 24 is formed on the metal pads 27 in the inter layer dielectric 22. The via plugs 23 are formed on the interconnect layer 24 in the inter layer dielectric 22. The semiconductor substrate 21 is formed above the inter layer dielectric 22 and the via plugs 23. An example of the semiconductor substrate 21 is a silicon substrate. In FIG. 1, the five interconnects in the interconnect layer 24 are respectively arranged on the five metal pads 27, and are in contact with these metal pads 27. An example of the interconnect material layer 24b is an Al layer, a W layer, or a Cu layer. Furthermore, in FIG. 1, the five via plugs 23 are respectively arranged on the five interconnects in the interconnect layer 24, and are in contact with these interconnects.

A vialess structure is adopted for the metal pads 17 and 27 of the present embodiment. Therefore, the metal pads 17 are arranged on the interconnect layer 14 without an intervention of via plugs, and are in contact with the interconnect layer 14. Furthermore, the metal pads 27 are arranged under the interconnect layer 24 without the intervention of via plugs, and are in contact with the interconnect layer 24.

In addition, the metal pads 17 and 27 of the present embodiment do not include a dummy pad. A dummy pad is a metal pad which is not electrically connected to an interconnect layer or via plugs. Therefore, the metal pads 17 and 27 of the present embodiment do not include the metal pads 17 which are not electrically connected to the interconnect layer 14 or the metal pads 27 which are not electrically connected to the interconnect layer 24.

In the case in which the vialess structure is adopted for the metal pads 17 and 27, a dummy pad, if included in the metal pads 17 and 27, is highly likely to be an obstruction when determining a layout of the interconnects in the interconnect layers 14 and 24. Therefore, in the case in which the vialess structure is adopted for the metal pads 17 and 27, it is desirable that the metal pads 17 and 27 do not include a dummy pad. Therefore, as described above, the metal pads 17 and 27 of the present embodiment do not include a dummy pad.

The vialess structure may not be adopted for one or both of the metal pads 17 and 27. In this case, one or both of the metal pads 17 and 27 may include a dummy pad. In addition, the respective interconnects in the interconnect layer 14 and the respective interconnects in the interconnect layer 24 may have any planar shape, and may have a linear shape extending in the X direction, the Y direction, or any other direction, for example, or may have a curved shape extending in various directions.

Next, still referring to FIG. 1, further details of the metal pads 17 and 27 of the present embodiment will be described.

The metal pads 17 of the present embodiment include a plurality of large pads 17L and a plurality of small pads 17S. The upper face of each of the small pads 17S is set to be smaller in area than the upper face of each of the large pads 17L. In other words, the planar shape of each of the small pads 17S is set to be smaller in size than the planar shape of each of the large pads 17L. The large pads 17L are an example of first pads, and the small pads 17S are an example of second pads.

In addition, the metal pads 27 of the present embodiment include a plurality of large pads 27L and a plurality of small pads 27S. The lower face of each of the small pads 27S is set to be smaller in area than the lower face of each of the large pads 27L. In other words, the planar shape of each of the small pads 27S is set to be smaller in size than the planar shape of each of the large pads 27L. The large pads 27L are an example of third pads, and the small pads 27S are an example of fourth pads.

In the present embodiment, the lower face of each of the large pads 27L is set to be equal in area to the upper face of each of the large pads 17L, and is set to be larger in area than the upper face of each of the small pads 17S. Furthermore, in the present embodiment, the lower face of each of the small pads 27S is set to be smaller in area than the upper face of each of the large pads 17L, and is set to be equal in area to the upper face of each of the small pads 17S. For example, in a case in which the metal pads 17 and 27 have a square planar shape, one side of the upper face of each of the small pads 17S and one side of the lower face of each of the small pads 27S are set to be shorter in length than one side of the upper face of each of the large pads 17L and one side of the lower face of each of the large pads 27L.

In the present embodiment, the large pads 27L are paired with the small pads 17S, and the small pads 27S are paired with the large pads 17L. Therefore, each of the large pads 27L is arranged on one of the small pads 17S, and each of the small pads 27S is arranged on one of the large pads 17L. These pairs will be called pad pairs. The semiconductor device of the present embodiment includes a plurality of pad pairs in each of which one of the large pads 27L is arranged on one of the small pads 17S, and includes a plurality of pad pairs in each of which one of the small pads 27S is arranged on one of the large pads 17L. FIG. 1 shows three pad pairs as the former pad pairs, and two pad pairs as the latter pad pairs. On the other hand, the semiconductor device of the present embodiment does not include pad pairs in which the large pads 27L are arranged on the large pads 17L, or pad pairs in which the small pads 27S are arranged on the small pads 17S.

As described above, in the present embodiment, the large pads 27L are paired with the small pads 17S, and the small pads 27S are paired with the large pads 17L. On the condition that the large pads 27L are paired with the large pads 17L, or the small pads 27S are paired with the small pads 17S, a misalignment between the metal pads 17 and the metal pads 27 raises a problem. For example, if a misalignment occurs when arranging the large pads 27L on the large pads 17L, the contact area between the upper faces of the large pads 17L and the lower faces of the large pads 27L is reduced, resulting in an increased contact resistance between the large pads 17L and the large pads 27L. On the other hand, even if a misalignment occurs when arranging the large pads 27L on the small pads 17S, the contact area is not changed if the misalignment is small, so that the contact resistance is not changed. Therefore, even if a misalignment between the metal pads 17 and the metal pads 27 occurs, the present embodiment makes it possible to prevent the problem associated with the misalignment.

Furthermore, the semiconductor device of the present embodiment includes a plurality of pad pairs in which the large pads 27L are arranged on the small pads 17S, and includes a plurality of pad pairs in which the small pads 27S are arranged on the large pads 17L. Advantages of such a structure will be described referring to FIGS. 2 to 4.

Figure 2:
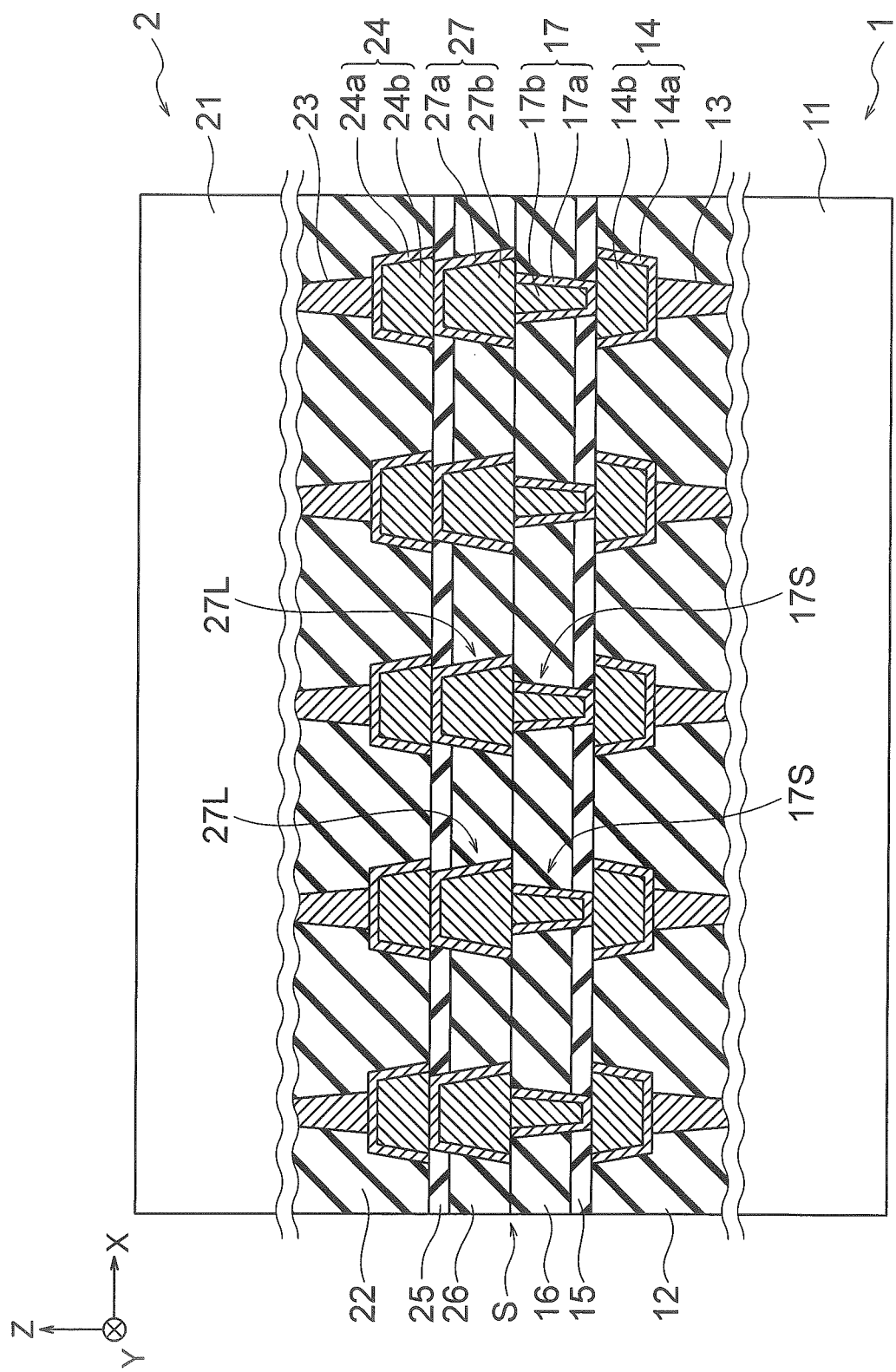
FIG. 2 is a cross-sectional view showing a structure of a semiconductor device of a comparative example of the first embodiment.

FIG. 2 is a cross-sectional view showing a structure of a semiconductor device of a comparative example of the first embodiment.

The semiconductor device of the present comparative example includes components identical to those of the semiconductor device of the present embodiment. However, the semiconductor device of the present comparative example does not include pad pairs in which the small pads 27S are arranged on the large pads 17L, although including pad pairs in which the large pads 27L are arranged on the small pads 17S.

Figure 3:
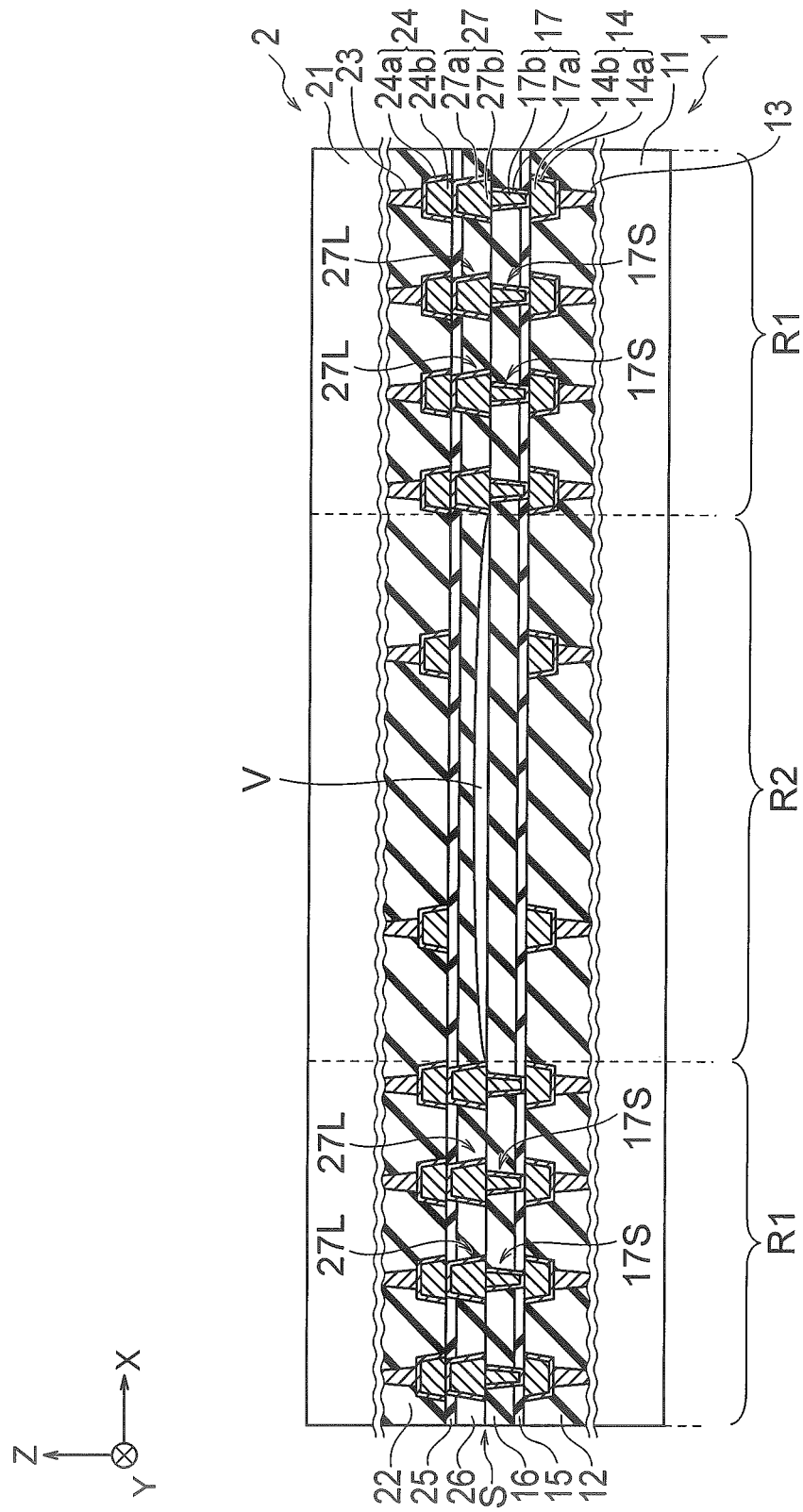
FIG. 3 is another cross-sectional view showing the structure of the semiconductor device of the comparative example of the first embodiment.

FIG. 3 is another cross-sectional view showing the structure of the semiconductor device of the comparative example of the first embodiment.

The cross-sectional view of FIG. 3 is equivalent to a zoomed out view of the cross-sectional view of FIG. 2. FIG. 3 shows a region R1 including the metal pads 17 and 27 and a region R2 not including the metal pads 17 and 27 as regions in the semiconductor device of the present comparative example.

Herein, an occupying rate of the metal pads 17 that occupy the upper face of the lower substrate 1 and an occupying rate of the metal pads 27 that occupy the lower face of the upper substrate 2 will be described. The upper face of the lower substrate 1 and the lower face of the upper substrate 2 form the bonding face S between the lower substrate 1 and the upper substrate 2.

The occupying rate of the metal pads 17 that occupy the upper face of the lower substrate 1 differs between the region R1 and the region R2. The occupying rate in the region R1 is given by dividing the area of the upper faces of all the metal pads 17 in the region R1 by the area of the upper face of the lower substrate 1 in the region R1. On the other hand, the occupying rate in the region R2 is given by dividing the area of the upper faces of all the metal pads 17 in the region R2 by the area of the upper face of the lower substrate 1 in the region R2. Since the region R2 does not include the metal pads 17, the occupying rate of the metal pads 17 in the region R2 is zero.

Similarly, the occupying rate of the metal pads 27 that occupy the lower face of the upper substrate 2 differs between the region R1 and the region R2. The occupying rate in the region R1 is given by dividing the area of the lower faces of all the metal pads 27 in the region R1 by the area of the lower face of the upper substrate 2 in the region R1. On the other hand, the occupying rate in the region R2 is given by dividing the area of the lower faces of all the metal pads 27 in the region R2 by the area of the lower face of the upper substrate 2 in the region R2. Since the region R2 does not include the metal pads 27, the occupying rate of the metal pads 27 in the region R2 is zero.

In the present comparative example, the occupying rate of the metal pads 27 in the region R1 is greater than the occupying rate of the metal pads 17 in the region R1. This is because the metal pads 27 in the upper substrate 2 only include the large pads 27L, and the metal pads 17 in the lower substrate 1 only include the small pads 17S.

As a result, in the upper substrate 2, a difference between the occupying rate of the metal pads 27 in the region R1 and the occupying rate of the metal pads 27 in the region R2 is large, that is, a sparse/dense difference of the metal pads 27 between the region R1 and the region R2 is large. Such a pad sparse/dense difference adversely affects chemical mechanical polishing (CMP) for planarizing the lower face of the upper substrate 2. In general, before bonding the lower substrate 1 and the upper substrate 2, the upper face of the lower substrate 1 and the lower face of the upper substrate 2 are planarized by CMP. At this time, if the sparse/dense difference of the metal pads 27 is large between the region R1 and the region R2, the lower face of the upper substrate 2 in the region R2 is removed to a larger extent than the lower face of the upper substrate 2 in the region R1, and a difference in level occurs between the lower face in the region R1 and the lower face in the region R2. As a result, when bonding the lower substrate 1 and the upper substrate 2, a void V may occur in the lower face of the upper substrate 2 in the region R1, or a joint failure between the metal pads 17 and 27 in the region R2 may occur.

This problem may also occur in a case in which a difference between the occupying rate of the metal pads 17 in the region R1 and the occupying rate of the metal pads 17 in the region R2 is large in the lower substrate 1. Therefore, it is desirable that the pad sparse/dense difference between the region R1 and the region R2 be reduced both in the upper substrate 2 and the lower substrate 1.

Figure 4:
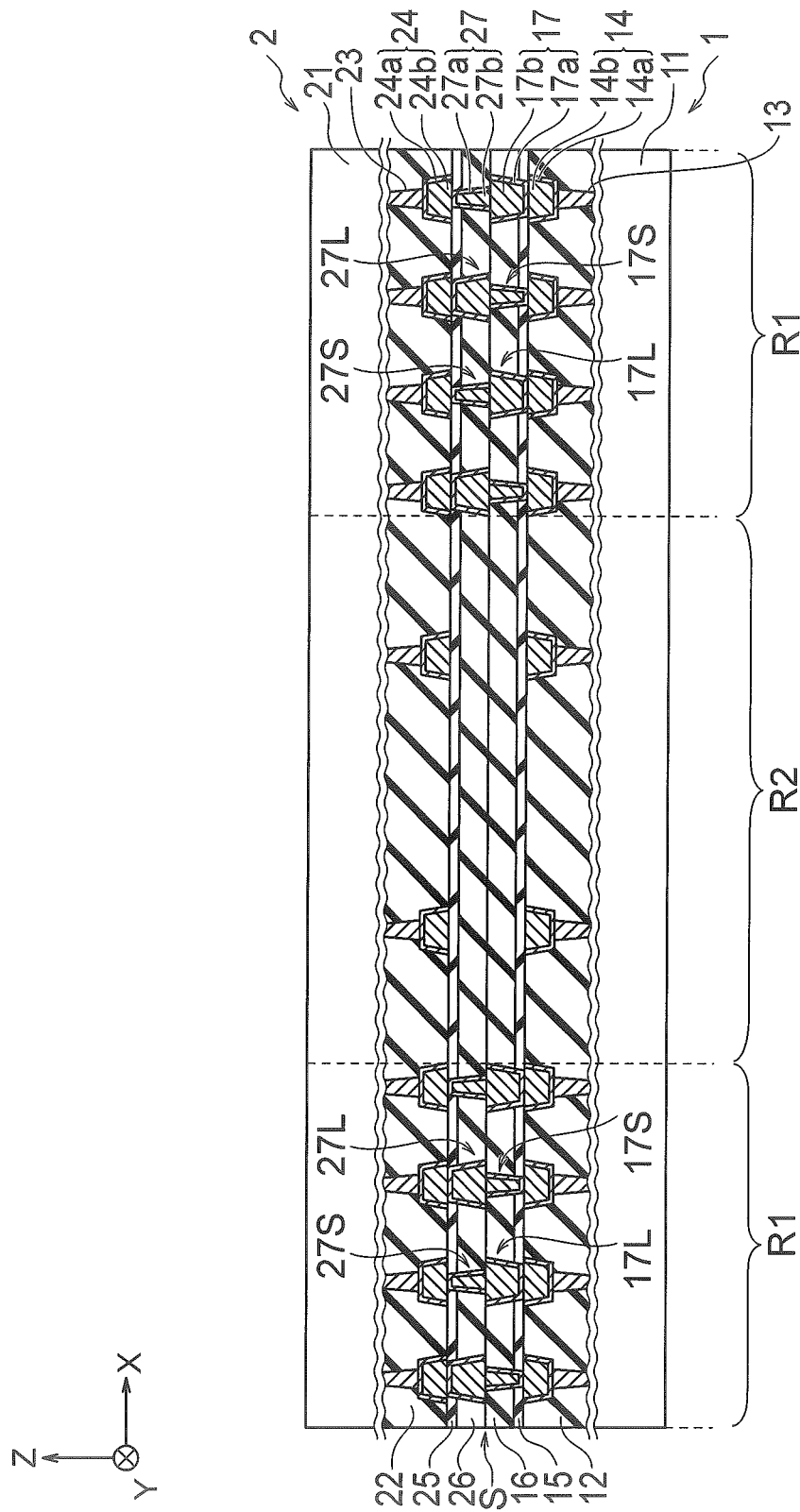
FIG. 4 is another cross-sectional view showing the structure of the semiconductor device of the first embodiment.
Figure 5:
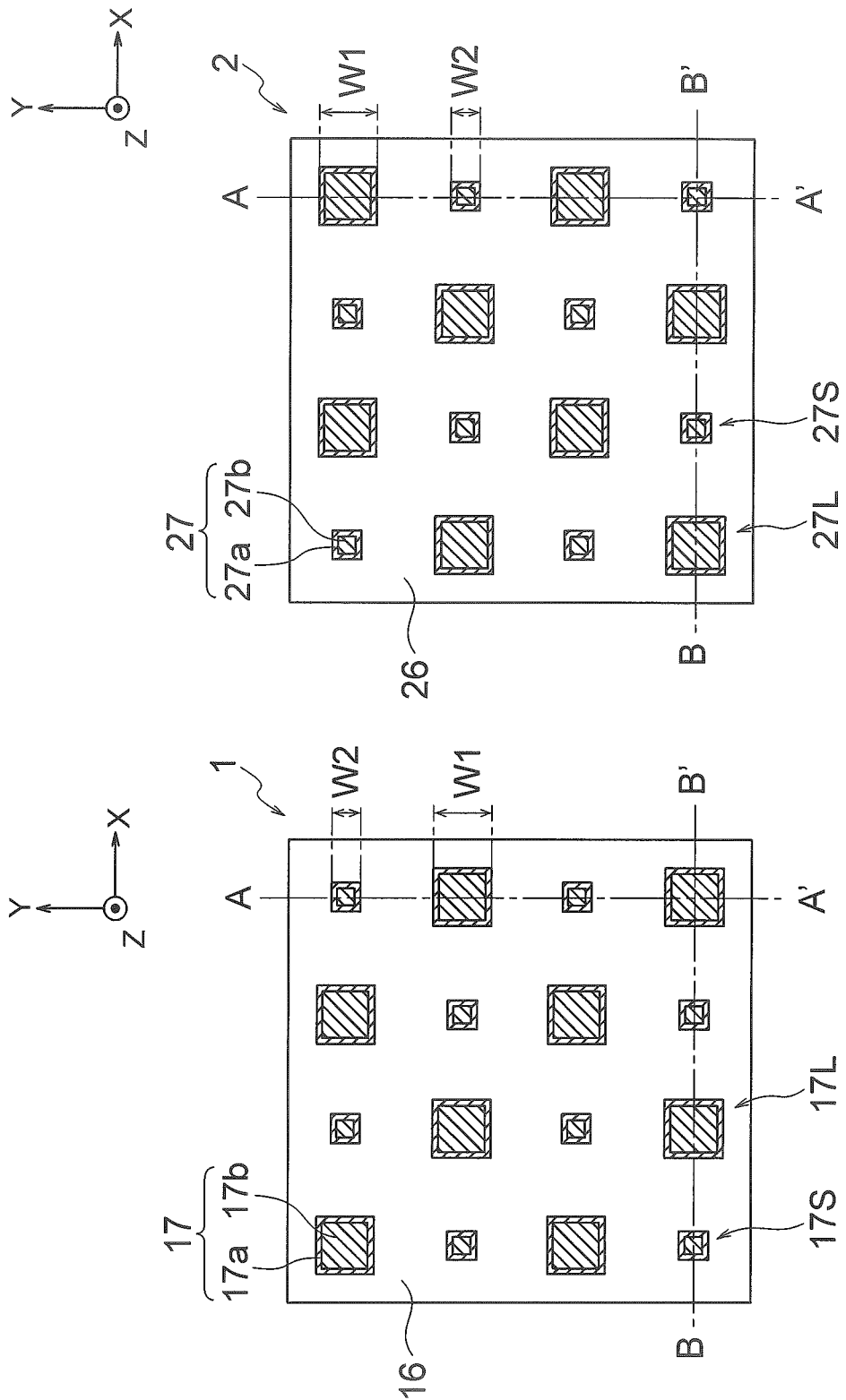
FIGS. 5A and 5B are plan views showing structures of a lower substrate and an upper substrate of the first embodiment.

FIG. 4 is another cross-sectional view showing the structure of the semiconductor device of the first embodiment.

The cross-sectional view of FIG. 4 is equivalent to a zoomed out view of the cross-sectional view of FIG. 1. FIG. 4 shows the region R1 including the metal pads 17 and 27 and the region R2 not including the metal pads 17 and 27 as regions in the semiconductor device of the present embodiment, similarly to FIG. 3.

In the present embodiment, the metal pads 27 in the upper substrate 2 include the large pads 27L and the small pads 27S, and the metal pads 17 in the lower substrate 1 also include the large pads 17L and the small pads 17S. Therefore, the present embodiment makes it possible to set both the occupying rate of the metal pads 27 in the region R1 and the occupying rate of the metal pads 17 in the region R1 at somewhat small values. In other words, the present embodiment makes it possible to reduce the pad sparse/dense difference between the region R1 and the region R2 both in the upper substrate 2 and the lower substrate 1. This makes it possible to prevent the void V and the joint failure described above.

The pad sparse/dense difference can be reduced by arranging a dummy pad in the region R2, for example. However, in the case in which the vialess structure is adopted for the metal pads 17 and 27 as described above, it may be difficult to arrange a dummy pad. The present embodiment makes it possible to reduce the pad sparse/ dense difference without using a dummy pad since the metal pads 27 in the upper substrate 2 include the large pads 27L and the small pads 27S, and the metal pads 17 in the lower substrate 1 also include the large pads 17L and the small pads 17S. The metal pads 17 and 27 of the present embodiment are applicable to both a semiconductor device in which a dummy pad is used and a semiconductor device in which a dummy pad is not used.

Herein, the ratio of the large pads 17L and the ratio of the large pads 27L in the upper face of the lower substrate 1 and the lower face of the upper substrate 2 in the region R1 will be described.

The ratio of the large pads 17L in the region R1 is given by dividing the number of all the large pads 17L in the region R1 by the number of all the metal pads 17 in the region R1. That is, this ratio represents the ratio of the number of the large pads 17L in the region R1 to the number of the metal pads 17 in the region R1. Similarly, the ratio of the large pads 27L in the region R1 is given by dividing the number of all the large pads 27L in the region R1 by the number of all the metal pads 27 in the region R1. That is, the ratio represents the ratio of the number of the large pads 27L in the region R1 to the number of the metal pads 27 in the region R1. It should be noted that, while the "occupying rate" described above is given by dividing a certain area by another area, the "ratio" described herein is given by dividing a certain number by another number.

In the present embodiment, it is desirable to set the ratio of the large pads 27L in the region R1 at 40 to 60% (for example, about 50%). Similarly, in the present embodiment, it is desirable to set the ratio of the large pads 17L in the region R1 at 40 to 60% (for example, about 50%). This makes it possible to, for example, reduce the pad sparse/dense difference both in the lower substrate 1 and the upper substrate 2, and to prevent the void V and the joint failure both in the lower substrate 1 and the upper substrate 2. The region R1 is an example of a predetermined region.

FIGS. 5A and 5B are plan views showing structures of the lower substrate 1 and the upper substrate 2 of the first embodiment.

FIG. 5A shows an appearance of the metal pads 17 in the lower substrate 1 as seen from above. The metal pads 17 of the present embodiment are arranged at intersections of a plurality of straight lines extending in the Y direction and a plurality of straight lines extending in the X direction, and as a result, are arranged in the form of a square lattice. FIG. 5A shows the line A-A' as an example of the former straight lines, and the line B-B' as an example of the latter straight lines.

On the line A-A', the plurality of large pads 17L and the plurality of small pads 17S are alternately arranged. Similarly, on the line B-B', the plurality of large pads 17L and the plurality of small pads 17S are alternately arranged. This also applies to straight lines extending in the Y direction other than the line A-A' and straight lines extending in the X direction other than the line B-B'. Such an arrangement makes it possible to make the ratio of the large pads 17L substantially uniform at each place in the upper face of the lower substrate 1 in the region R1, that is, makes it possible to increase the uniformity of the ratio of the large pads 17L.

FIG. 5A also shows a width W1 of the upper face of each of the large pads 17L in the Y direction and a width W2 of the upper face of each of the small pads 17S in the Y direction. The upper faces of the large pads 17L and the small pads 17S of the present embodiment have a square shape, for example. Therefore, the width W1 represents the length of one side of the square which is the planar shape of the large pads 17L, and the width W2 represents the length of one side of the square which is the planar shape of the small pads 17S. The width W1 is set to be longer than the width W2 (W1>W2), and desirably is set to be more than or equal to 1.1 times the width W2 (W1≥1.1×W2), for example. The width W1 is 400 nm, for example. The width W2 is 200 nm, for example.

FIG. 5B shows an appearance of the metal pads 27 in the upper substrate 2 as seen from above. The metal pads 27 of the present embodiment are also arranged at intersections of a plurality of straight lines extending in the Y direction and a plurality of straight lines extending in the X direction, and as a result, are arranged in the form of a square lattice. Similarly to FIG. 5A, FIG. 5B shows the line A-A' as an example of the former straight lines, and the line B-B' as an example of the latter straight lines.

The shape and arrangement of the metal pads 27 shown in FIG. 5B are similar to the shape and arrangement of the metal pads 17 shown in FIG. 5A. However, the positions at which the large pads 27L are arranged in FIG. 5B correspond to the positions at which the small pads 17S are arranged in FIG. 5A. On the other hand, the positions at which the small pads 27S are arranged in FIG. 5B correspond to the positions at which the large pads 17L are arranged in FIG. 5A. As a result, the large pads 27L are paired with the small pads 17S, and the small pads 27S are paired with the large pads 17L.

Figure 6:
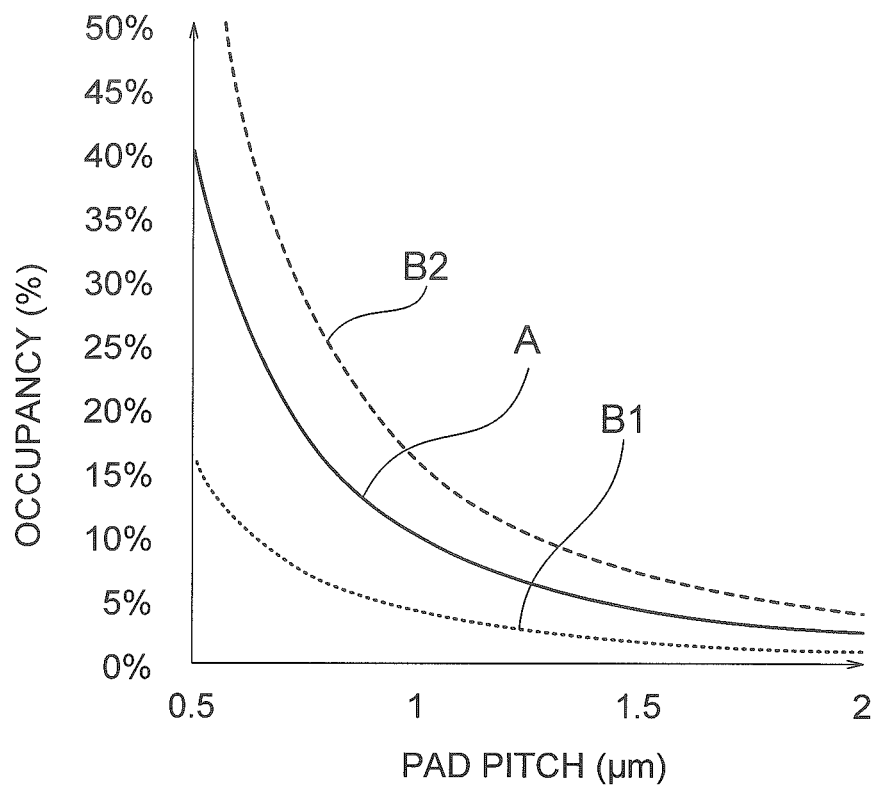
FIG. 6 is a graph showing a relation between a pad pitch and an occupying rate (occupancy) of the semiconductor device of the first embodiment.

FIG. 6 is a graph showing a relation between a pad pitch and an occupying rate (occupancy) of the semiconductor device of the first embodiment.

In FIG. 6, a curve A shows a relation between a pad pitch and an occupying rate in the lower substrate 1 or the upper substrate 2 of the present embodiment. A curve B1 shows a relation between a pad pitch and an occupying rate in the lower substrate 1 of the above-described comparative example. A curve B2 shows a relation between a pad pitch and an occupying rate in the upper substrate 2 of the above-described comparative example.

The pad pitch on the horizontal axis in FIG. 6 represents the pitch between the metal pads 17 and 27. The occupying rate on the vertical axis in FIG. 6 represents the occupying rate of the metal pads 17 and 27 in the region R1. The upper substrate 2 of the above-described comparative example only includes the large pads 27L, and the lower substrate 1 of the above-described comparative example only includes the small pads 17S. Therefore, at the same pad pitch, the occupying rate (B2) in the upper substrate 2 of the above-described comparative example is greater than the occupying rate (B1) in the lower substrate 1 of the above-described comparative example.

In the upper substrate 2 of the above-described comparative example, the occupying rate (B2) of the metal pads 27 in the region R1 is great, and the difference between the occupying rate in the region R1 and the occupying rate in the region R2 (=0%) is great. This causes the void V and the contact failure to occur in the above-described comparative example. On the other hand, in the upper substrate 2 of the present embodiment, the occupying rate (A) of the metal pads 27 in the region R1 is smaller than that of the above-described comparative example, and the difference between the occupying rate in the region R1 and the occupying rate in the region R2 (=0%) is small. Therefore, the present embodiment makes it possible to prevent the void V and the contact failure.

Figure 7A:
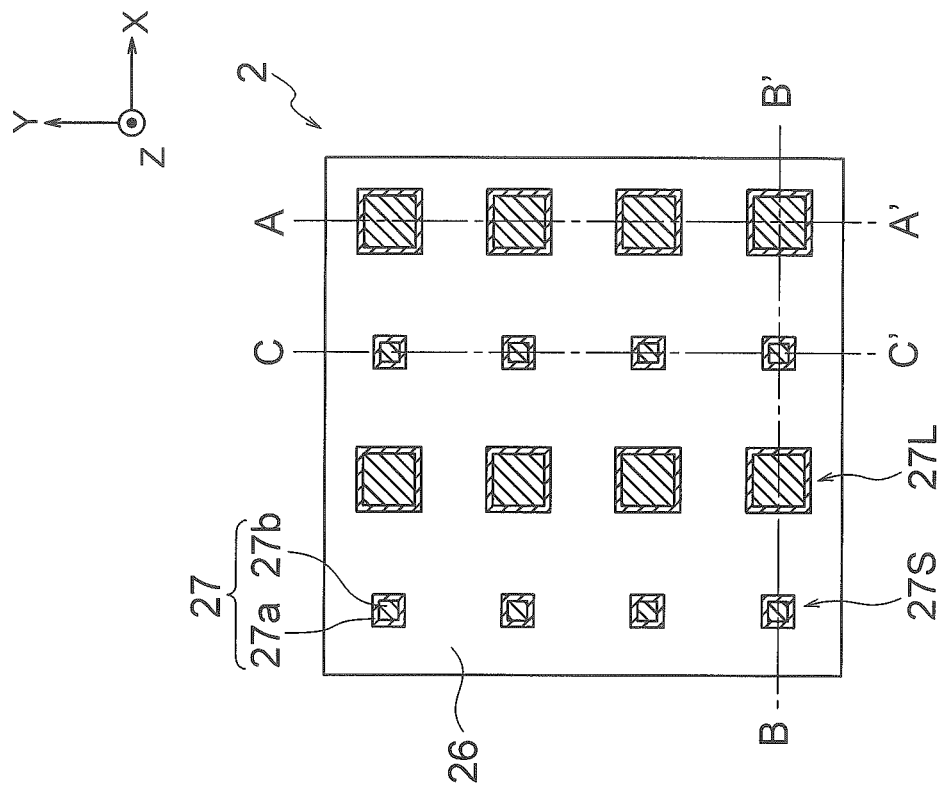
FIGS. 7A and 7B are plan views showing structures of a lower substrate and an upper substrate of a first modification of the first embodiment.
Figure 7B:
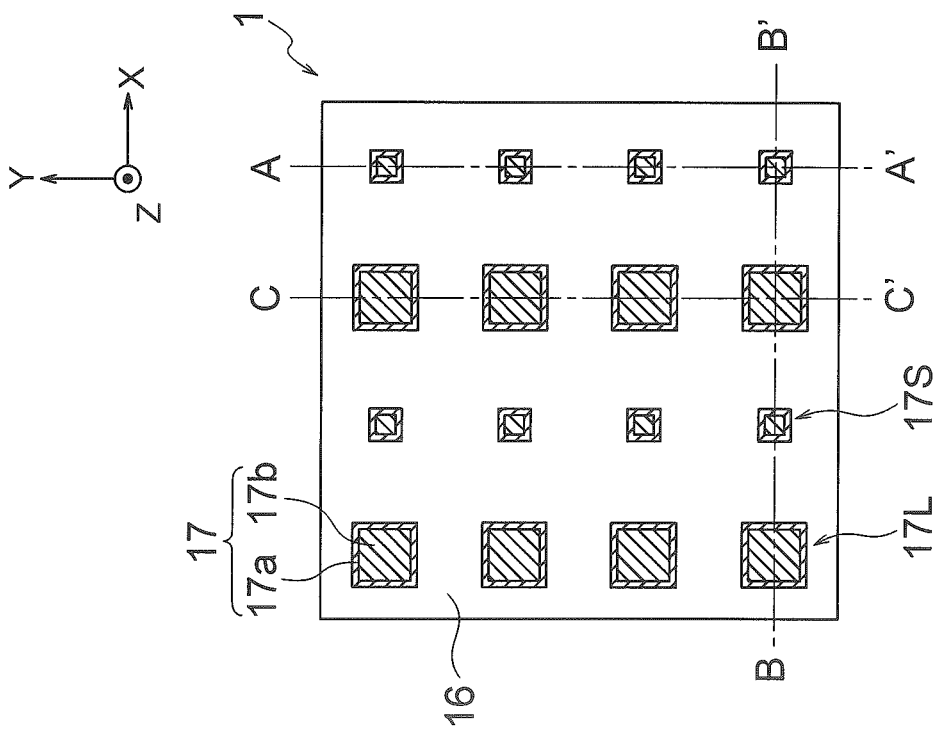

FIGS. 7A and 7B are plan views showing structures of the lower substrate 1 and the upper substrate 2 of a first modification of the first embodiment.

FIG. 7A shows an appearance of the metal pads 17 in the lower substrate 1 as seen from above. The metal pads 17 of the present modification are arranged at intersections of a plurality of straight lines extending in the Y direction and a plurality of straight lines extending in the X direction, and as a result, are arranged in the form of a square lattice. FIG. 7A shows the line A-A' and the line C-C' as examples of the former straight lines, and shows the line B-B' as an example of the latter straight lines.

In FIG. 7A, the straight lines extending in the Y direction alternately include a plurality of straight lines only including the large pads 17L such as the line C-C' and a plurality of straight lines only including the small pads 17S such as the line A-A'. The former straight lines are an example of first straight lines, the latter straight lines are an example of second straight lines, and the Y direction is an example of a predetermined direction. On the other hand, on the line B-B', the plurality of large pads 17L and the plurality of small pads 17S are alternately arranged. This also applies to the straight lines extending in the X direction other than the line B-B'. Such an arrangement in the form of a square lattice makes it possible to make the ratio of the large pads 17L substantially uniform at each place in the upper face of the lower substrate 1 in the region R1, that is, makes it possible to increase the uniformity of the ratio of the large pads 17L.

FIG. 7B shows an appearance of the metal pads 27 in the upper substrate 2 as seen from above. The metal pads 27 of the present modification are also arranged at intersections of a plurality of straight lines extending in the Y direction and a plurality of straight lines extending in the X direction, and as a result, are arranged in the form of a square lattice. Similarly to FIG. 7A, FIG. 7B shows the line A-A' and the line C-C' as examples of the former straight lines, and shows the line B-B' as an example of the latter straight lines.

The shape and arrangement of the metal pads 27 shown in FIG. 7B are similar to the shape and arrangement of the metal pads 17 shown in FIG. 7A. However, the positions at which the large pads 27L are arranged in FIG. 7B correspond to the positions at which the small pads 17S are arranged in FIG. 7A. On the other hand, the positions at which the small pads 27S are arranged in FIG. 7B correspond to the positions at which the large pads 17L are arranged in FIG. 7A. As a result, the large pads 27L are paired with the small pads 17S, and the small pads 27S are paired with the large pads 17L.

Figure 8A:
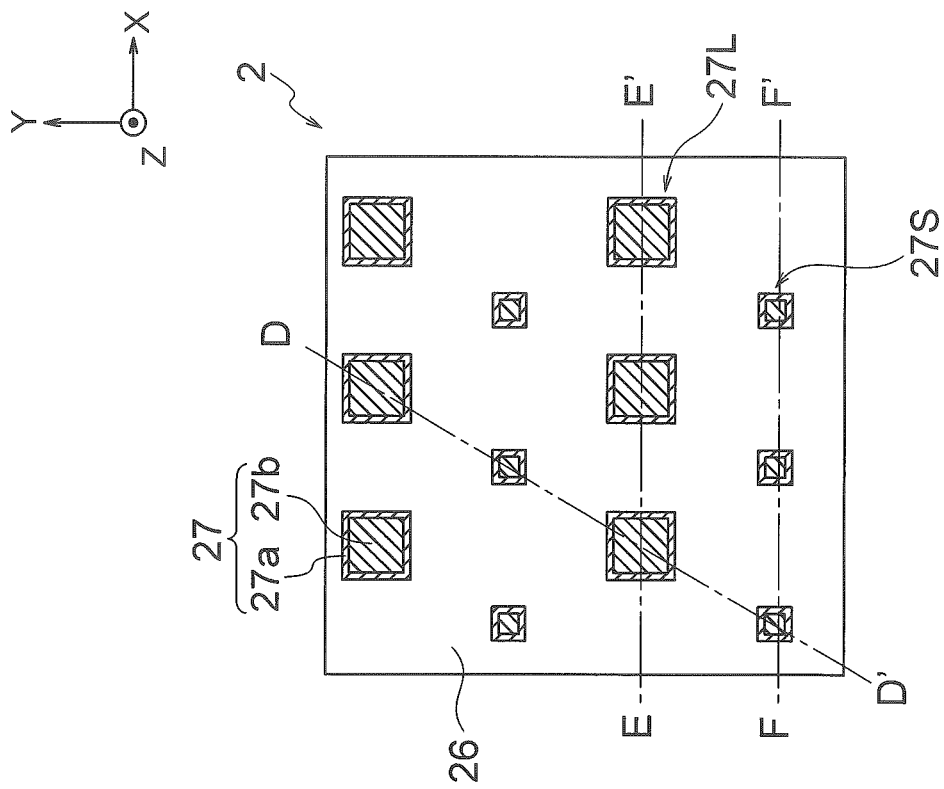
FIGS. 8A and 8B are plan views showing structures of a lower substrate and an upper substrate of a second modification of the first embodiment.
Figure 8B:
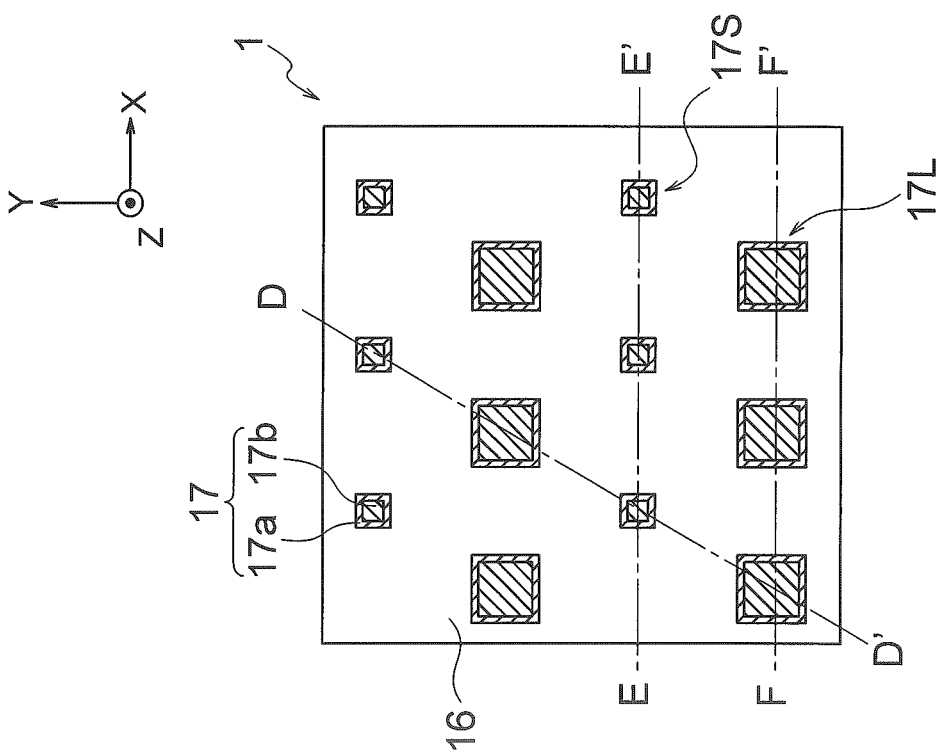

FIGS. 8A and 8B are plan views showing structures of the lower substrate 1 and the upper substrate 2 of a second modification of the first embodiment.

FIG. 8A shows an appearance of the metal pads 17 in the lower substrate 1 as seen from above. The metal pads 17 of the present modification are arranged at intersections of a plurality of straight lines extending in an oblique direction and a plurality of straight lines extending in the X direction, and as a result, are arranged in the form of a triangle lattice. FIG. 8A shows the line D-D' as an example of the former straight lines, and shows the line E-E' and the line F-F' as examples of the latter straight lines. The former straight lines extend in parallel to each other similarly to the latter straight lines.

In FIG. 8A, the straight lines extending in the X direction alternately include a plurality of straight lines only including the large pads 17L such as the line F-F' and a plurality of straight lines only including the small pads 17S such as the line E-E'. The former straight lines are an example of the first straight lines, the latter straight lines are an example of the second straight lines, and the X direction is an example of the predetermined direction. On the other hand, on the line D-D', the plurality of large pads 17L and the plurality of small pads 17S are alternately arranged. This also applies to the straight lines extending in the oblique direction other than the line D-D'. Such an arrangement in the form of a triangle lattice makes it possible to make the ratio of the large pads 17L substantially uniform at each place in the upper face of the lower substrate 1 in the region R1, that is, makes it possible to increase the uniformity of the ratio of the large pads 17L.

FIG. 8B shows an appearance of the metal pads 27 in the upper substrate 2 as seen from above. The metal pads 27 of the present modification are also arranged at intersections of a plurality of straight lines extending in an oblique direction and a plurality of straight lines extending in the X direction, and as a result, are arranged in the form of a triangle lattice. Similarly to FIG. 8A, FIG. 8B shows the line D-D' as an example of the former straight lines, and shows the line E-E' and the line F-F' as examples of the latter straight lines. The former straight lines extend in parallel to each other similarly to the latter straight lines.

The shape and arrangement of the metal pads 27 shown in FIG. 8B are similar to the shape and arrangement of the metal pads 17 shown in FIG. 8A. However, the positions at which the large pads 27L are arranged in FIG. 8B correspond to the positions at which the small pads 17S are arranged in FIG. 8A. On the other hand, the positions at which the small pads 27S are arranged in FIG. 8B correspond to the positions at which the large pads 17L are arranged in FIG. 8A. As a result, the large pads 27L are paired with the small pads 17S, and the small pads 27S are paired with the large pads 17L.

Figure 9A:
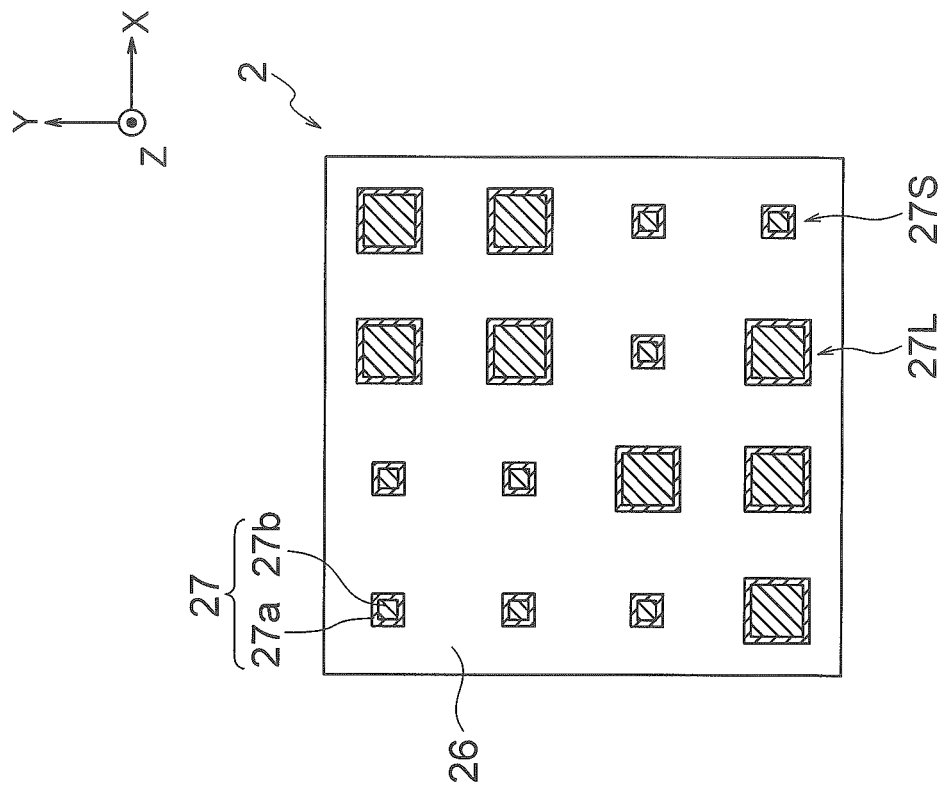
FIGS. 9A and 9B are plan views showing structures of a lower substrate and an upper substrate of a third modification of the first embodiment.
Figure 9B:
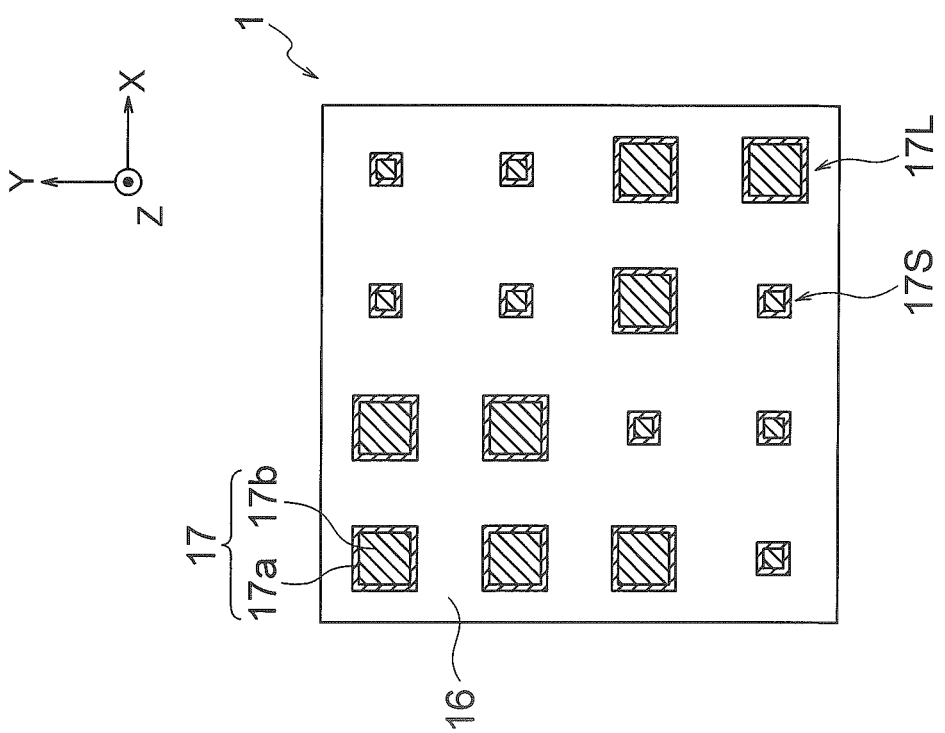

FIGS. 9A and 9B are plan views showing structures of the lower substrate 1 and the upper substrate 2 of a third modification of the first embodiment.

FIG. 9A shows an appearance of the metal pads 17 in the lower substrate 1 as seen from above. The metal pads 17 of the present modification are arranged at intersections of a plurality of straight lines extending in the Y direction and a plurality of straight lines extending in the X direction, and as a result, are arranged in the form of a square lattice. However, the metal pads 17 of the present modification are arranged in the form of a square lattice such that the large pads 17L and the small pads 17S are arranged at these intersections at random. Such an arrangement makes it possible to improve flexibility in laying out the interconnects in the interconnect layer 14, for example. For example, arranging many of the small pads 17S on a region with a high density of interconnects and arranging many of the large pads 17L on a region with a low density of interconnects makes it possible to avoid the metal pads 17 interfering with arrangement of the interconnects.

FIG. 9B shows an appearance of the metal pads 27 in the upper substrate 2 as seen from above. The metal pads 27 of the present modification are also arranged at intersections of a plurality of straight lines extending in the Y direction and a plurality of straight lines extending in the X direction, and as a result, are arranged in the form of a square lattice.

The shape and arrangement of the metal pads 27 shown in FIG. 9B are similar to the shape and arrangement of the metal pads 17 shown in FIG. 9A. However, the positions at which the large pads 27L are arranged in FIG. 9B correspond to the positions at which the small pads 17S are arranged in FIG. 9A. On the other hand, the positions at which the small pads 27S are arranged in FIG. 9B correspond to the positions at which the large pads 17L are arranged in FIG. 9A. As a result, the large pads 27L are paired with the small pads 17S, and the small pads 27S are paired with the large pads 17L.

In the upper substrate 2 of the present modification, the ratio of the large pads 27L in the region R1 is set at about 60%. As a result, in the lower substrate 1 of the present modification, the ratio of the large pads 17L in the region R1 is set at about 40%. This makes it possible to improve flexibility in laying out the interconnects in the interconnect layer 14. Such setting of occupying rates is employed in a case of intending to give more priority to improvement of flexibility in laying out the interconnects in the interconnect layer 14 than to improvement of flexibility in laying out the interconnects in the interconnect layer 24, for example.

Figure 10:
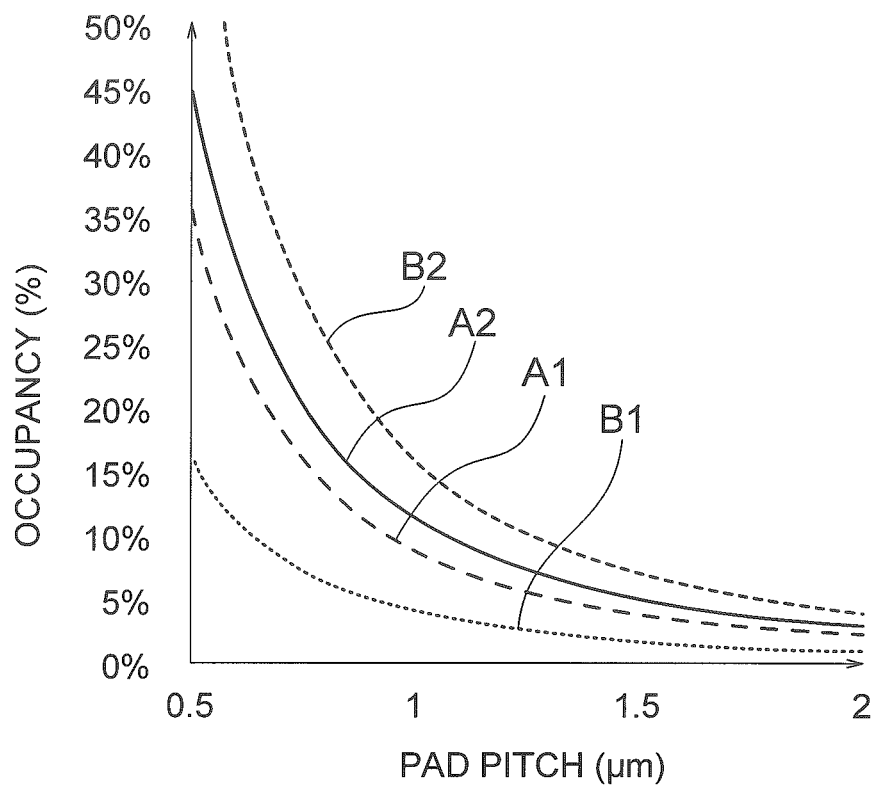
FIG. 10 is a graph showing a relation between a pad pitch and an occupying rate (occupancy) of a semiconductor device of the third modification of the first embodiment.

FIG. 10 is a graph showing a relation between a pad pitch and an occupying rate (occupancy) of a semiconductor device of the third modification of the first embodiment.

In FIG. 10, a curve A1 shows a relation between a pad pitch and an occupying rate in the lower substrate 1 of the present modification, and a curve A2 shows a relation between a pad pitch and an occupying rate in the upper substrate 2 of the present modification. In addition, the curve B1 shows a relation between a pad pitch and an occupying rate in the lower substrate 1 of the above-described comparative example, and the curve B2 shows a relation between a pad pitch and an occupying rate in the upper substrate 2 of the above-described comparative example. The pad pitch on the horizontal axis in FIG. 10 represents the pitch between the metal pads 17 and 27. The occupying rate on the vertical axis in FIG. 10 represents the occupying rate of the metal pads 17 and 27 in the region R1.

In the present modification, the ratio of the large pads 27L in the region R1 is set at about 60%, and the ratio of the large pads 17L in the region R1 is set at about 40%. Therefore, at the same pad pitch, the occupying rate (A2) of the large pads 27L in the upper substrate 2 of the present modification is greater than the occupying rate (A1) of the large pads 17L in the lower substrate 1 of the present modification. However, the difference between the occupying rate in the region R1 and the occupying rate in the region R2 in the upper substrate 2 of the present modification is kept smaller than that of the above-described comparative example. Therefore, the present modification makes it possible to prevent the void V and the contact failure.

As described above, in the semiconductor device of the present embodiment, the large pads 27L are paired with the small pads 17S, and the small pads 27S are paired with the large pads 17L. Therefore, the present embodiment makes it possible to prevent the metal pads 17 and 27 from adversely affecting the inter layer dielectrics 16 and 26, and makes it possible to prevent the void V from occurring in the inter layer dielectrics 16 and 26, for example. In addition, the present embodiment makes it possible to prevent the joint failure from occurring in the metal pads 17 and 27.

The lower substrate 1 includes the metal pads 17 having two types of sizes (the large pads 17L and the small pads 17S) in the present embodiment, but may include the metal pads 17 having three or more types of sizes. Similarly, the upper substrate 2 includes the metal pads 27 having two types of sizes (the large pads 27L and the small pads 27S) in the present embodiment, but may include the metal pads 27 having three or more types of sizes. In addition, the size of the large pads 27L may be different from the size of the large pads 17L, and the size of the small pads 27S may be different from the size of the small pads 17S.

In addition, the metal pads 17 and 27 have a square planar shape in the present embodiment, but may have another (for example, rectangular or circular) shape.

Second Embodiment

FIGS. 11A to 15 are cross-sectional views showing a method of manufacturing a semiconductor device of a second embodiment. The method of the present embodiment is performed for manufacturing the semiconductor device of the first embodiment.

First, a lower substrate 1' in FIG. 11A and an upper substrate 2' in FIG. 11B are manufactured. The lower substrate 1' is a substrate in a wafer state, and is used for manufacturing the lower substrate 1 of the first embodiment. Similarly, the upper substrate 2' is a substrate in a wafer state, and is used for manufacturing the upper substrate 2 of the first embodiment.

The lower substrate 1' in FIG. 11A is manufactured by forming the inter layer dielectric 12, the via plugs 13, the interconnect layer 14, the insulator 15, and the inter layer dielectric 16 on the semiconductor substrate 11. The interconnect layer 14 is formed in the inter layer dielectric 12 so as to include a plurality of interconnects. The interconnect layer 14 is electrically connected to a CMOS circuit (not shown) of a three-dimensional memory through the via plugs 13 under the interconnect layer 14, for example. The insulator 15 and the inter layer dielectric 16 are sequentially formed on the inter layer dielectric 12 and the interconnect layer 14. The insulator 15 is a silicon nitride film having a thickness of 50 nm, for example. The inter layer dielectric 16 is a silicon oxide film having a thickness of 250 nm, for example.

The upper substrate 2' in FIG. 11B is manufactured by forming the inter layer dielectric 22, the via plugs 23, the interconnect layer 24, the insulator 25, and the inter layer dielectric 26 on the semiconductor substrate 21. The interconnect layer 24 is formed in the inter layer dielectric 22 so as to include a plurality of interconnects. The interconnect layer 24 is electrically connected to a memory cell array (not shown) of a three-dimensional memory through the via plugs 23 under the interconnect layer 24, for example. The insulator 25 and the inter layer dielectric 26 are sequentially formed on the inter layer dielectric 22 and the interconnect layer 24. The insulator 25 is a silicon nitride film having a thickness of 50 nm, for example. The inter layer dielectric 26 is a silicon oxide film having a thickness of 250 nm, for example.

Next, a plurality of openings 18 extending through the inter layer dielectric 16 and the insulator 15 are formed by dry etching, and a plurality of openings 28 extending through the inter layer dielectric 26 and the insulator 25 are formed by dry etching (FIGS. 12A and 12B). As a result, the upper face of one interconnect of the interconnect layer 14 is exposed in each of the openings 18, and the upper face of one interconnect of the interconnect layer 24 is exposed in each of the openings 28. At this time, the insulators 15 and 25 are used as etch stoppers. The openings 18 are an example of lower openings, and the openings 28 are an example of upper openings.

The openings 18 are formed so as to include a plurality of large openings 18L and a plurality of small openings 18S. The large openings 18L are used for embedding the large pads 17L, and the small openings 18S are used for embedding the small pads 17S. Therefore, the openings 18 of the present embodiment are formed so as to have a square planar shape. On the other hand, the openings 18 may be formed so as to have a circular planar shape. For example, the planar shape of the large openings 18L is set at a circle having a diameter of 600 nm, and the planar shape of the small openings 18S is set at a circle having a diameter of 200 nm.

The large openings 18L and the small openings 18S of the present embodiment are respectively arranged so as to present the same layout as the large pads 17L and the small pads 17S shown in FIG. 5A.

The openings 28 are formed so as to include a plurality of large openings 28L and a plurality of small openings 28S. The large openings 28L are used for embedding the large pads 27L, and the small openings 28S are used for embedding the small pads 27S. Therefore, the openings 28 of the present embodiment are formed so as to have a square planar shape. On the other hand, the openings 28 may be formed so as to have a circular planar shape. For example, the planar shape of the large openings 28L is set at a circle having a diameter of 600 nm, and the planar shape of the small openings 28S is set at a circle having a diameter of 200 nm. The large openings 28L and the small openings 28S of the present embodiment are respectively arranged so as to present the same layout as the large pads 27L and the small pads 27S shown in FIG. 5B.

Next, the barrier metal layer 17a and the interconnect material layer 17b are sequentially formed on the inter layer dielectric 16, the insulator 15, and the interconnect layer 14, and the barrier metal layer 27a and the interconnect material layer 27b are sequentially formed on the inter layer dielectric 26, the insulator 25, and the interconnect layer 24 (FIGS. 13A and 13B). As a result, the barrier metal layer 17a and the interconnect material layer 17b are embedded in the openings 18, and the barrier metal layer 27a and the interconnect material layer 27b are embedded in the openings 28. The barrier metal layer 17a and the interconnect material layer 17b are examples of materials of the lower pads, and the barrier metal layer 27a and the interconnect material layer 27b are examples of materials of the upper pads.

The barrier metal layer 17a is formed on side faces and a bottom face of each of the openings 18. An example of the barrier metal layer 17a is a Ta (tantalum) layer having a thickness of 10 nm. The interconnect material layer 17b is formed in each of the openings 18 with the interposition of the barrier metal layer 17a. An example of the interconnect material layer 17b is a Cu layer having a thickness of 500 nm.

The barrier metal layer 27a is formed on side faces and a bottom face of each of the openings 28. An example of the barrier metal layer 27a is a Ta layer having a thickness of 10 nm. The interconnect material layer 27b is formed in each of the openings 28 with the interposition of the barrier metal layer 27a. An example of the interconnect material layer 27b is a Cu layer having a thickness of 500 nm.

Next, the surfaces of the interconnect material layer 17b and the barrier metal layer 17a are planarized by CMP, and the surfaces of the interconnect material layer 27b and the barrier metal layer 27a are planarized by CMP (FIGS. 14A and 14B). The CMP is performed using a slurry containing silica particles as a grindstone and hydrogen peroxide as an oxidizing agent, for example.

The CMP for the lower substrate 1' is performed so as to remove surpluses of the interconnect material layer 17b and the barrier metal layer 17a outside the openings 18. As a result, the interconnect material layer 17b and the barrier metal layer 17a are left in the openings 18, and the metal pads 17 are formed in the openings 18. The metal pads 17 are formed so as to be in contact with the interconnect layer 14 in the openings 18. The large pads 17L and the small pads 17S included in the metal pads 17 are arranged so as to present the layout shown in FIG. 5A. This makes it possible to prevent a difference in level that would cause the void V from being produced in the lower substrate 1' by the CMP.

The CMP for the upper substrate 2' is performed so as to remove surpluses of the interconnect material layer 27b and the barrier metal layer 27a outside the openings 28. As a result, the interconnect material layer 27b and the barrier metal layer 27a are left in the openings 28, and the metal pads 27 are formed in the openings 28. The metal pads 27 are formed so as to be in contact with the interconnect layer 24 in the openings 28. The large pads 27L and the small pads 27S included in the metal pads 27 are arranged so as to present the layout shown in FIG. 5B. This makes it possible to prevent a difference in level that would cause the void V from being produced in the upper substrate 2' by the CMP.

Figure 15:
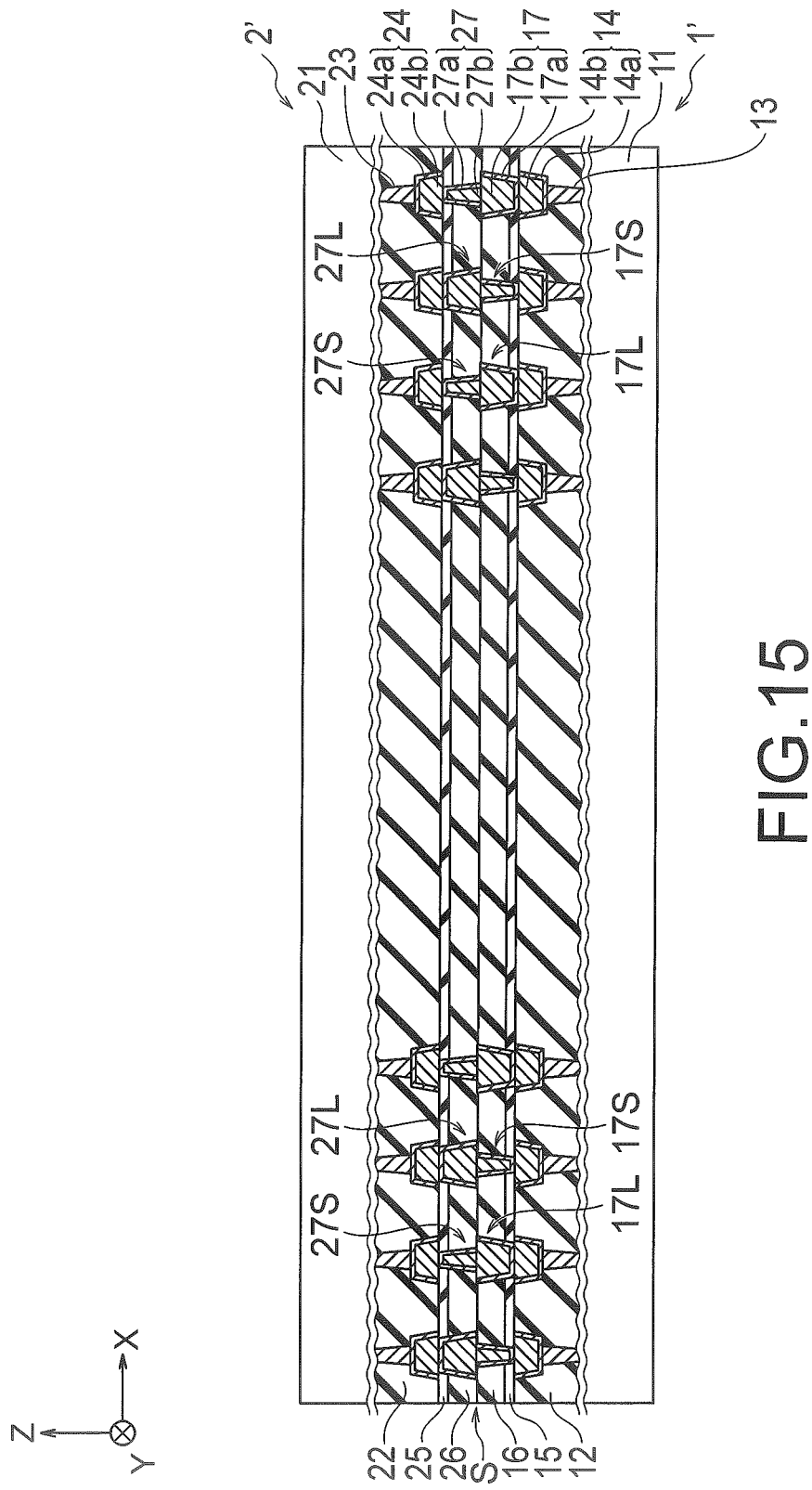

Next, the upper substrate 2' is turned upside down, and bonded to the lower substrate 1' (FIG. 15). This bonding is performed such that the large pads 27L are arranged on the small pads 17S, the small pads 27S are arranged on the large pads 17L, and the inter layer dielectric 26 is arranged on the inter layer dielectric 16. Thereafter, by annealing the lower substrate 1' and the upper substrate 2', the large pads 27L are joined to the small pads 17S, the small pads 27S are joined to the large pads 17L, and the inter layer dielectric 26 is affixed to the inter layer dielectric 16. The present embodiment makes it possible to prevent the void V and the joint failure from occurring after the bonding by employing the layouts shown in FIGS. 5A and 5B.

Thereafter, the lower substrate 1' and the upper substrate 2' are cut into individual semiconductor devices by dicing. The semiconductor device of the present embodiment including the lower substrate 1 and the upper substrate 2 is manufactured in this manner. Before performing dicing, the semiconductor substrate 21 may be removed from the upper substrate 2'.

In the present embodiment, the semiconductor device of the first embodiment is manufactured by bonding the lower substrate 1' and the upper substrate 2'. Therefore, the present embodiment makes it possible to prevent the metal pads 17 and 27 from adversely affecting the inter layer dielectrics 16 and 26, and makes it possible to prevent the void V from occurring in the inter layer dielectrics 16 and 26, for example. The present embodiment also makes it possible to prevent the joint failure from occurring in the metal pads 17 and 27.

The method of the present embodiment can also be used for manufacturing the semiconductor device of the first, second, or third modification. In this case, the large openings 18L and the small openings 18S are respectively arranged so as to present the same layout as the large pads 17L and the small pads 17S shown in FIG. 7A, FIG. 8A, or FIG. 9A. Furthermore, the large openings 28L and the small openings 28S are respectively arranged so as to present the same layout as the large pads 27L and the small pads 27S shown in FIG. 7B, FIG. 8B, or FIG. 9B.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a lower interconnect layer including a plurality of lower interconnects;

a plurality of lower pads provided on the lower interconnects;

a plurality of upper pads provided on the lower pads and being in contact with the lower pads; and an upper interconnect layer including a plurality of upper interconnects provided on the upper pads, wherein the lower pads include a plurality of first pads and a plurality of second pads, and the upper pads include a plurality of third pads provided on the second pads and a plurality of fourth pads provided on the first pads, a lower face of each third pad being larger in area than an upper face of each second pad, a lower face of each fourth pad being smaller in area than an upper face of each first pad.

2. The device of claim 1, wherein the upper face of each second pad is smaller in area than the upper face of each first pad, and the lower face of each fourth pad is smaller in area than the lower face of each third pad.

3. The device of claim 1, wherein the lower face of each third pad is equal in area to the upper face of each first pad, and the lower face of each fourth pad is equal in area to the upper face of each second pad.

4. The device of claim 1, wherein the upper pads do not include a third pad provided on a first pad, and do not include a fourth pad provided on a second pad.

5. The device of claim 1, wherein the lower pads and the upper pads do not include a lower pad that is not electrically connected to a lower interconnect, and/or do not include a upper pad that is not electrically connected to an upper interconnect.

6. The device of claim 1, wherein the lower pads include the first and second pads alternately arranged on an identical straight line.

7. The device of claim 6, wherein the lower pads are arranged in a form of a square lattice or a triangle lattice.

8. The device of claim 1, wherein the lower pads include the first pads arranged on first straight lines extending in a predetermined direction, and the second pads arranged on second straight lines extending in the predetermined direction alternately with the first straight lines.

9. The device of claim 8, wherein the lower pads are arranged in a form of a square lattice or a triangle lattice.

10. The device of claim 1, further comprising:

a lower substrate including the lower interconnect layer and the lower pads; and an upper substrate including the upper interconnect layer and the upper pads, wherein, in a predetermined region in a boundary face between the lower substrate and the upper substrate, a ratio of a number of the first pads to a number of the lower pads in the predetermined region is 40 to 60%, and/or a ratio of a number of the third pads to a number of the upper pads in the predetermined region is 40 to 60%.

11. The device of claim 1, wherein the lower pads are in contact with the lower interconnects, and/or the upper pads are in contact with the upper interconnects.

12. The device of claim 1, wherein a width of the upper face of each first pad is more than or equal to 1.1 times a width of the upper face of each second pad, and a width of the lower face of each third pad is more than or equal to 1.1 times a width of the lower face of each fourth pad.

13. The device of claim 1, wherein a width of the upper face of each first pad is more than or equal to 1.1 times a width of the lower face of each fourth pad, and a width of the lower face of each third pad is more than or equal to 1.1 times a width of the upper face of each second pad.

14. A method of manufacturing a semiconductor device, comprising:

forming a lower substrate that includes a lower interconnect layer including a plurality of lower interconnects, and a plurality of lower pads provided on the lower interconnects;

forming an upper substrate that includes an upper interconnect layer including a plurality of upper interconnects, and a plurality of upper pads provided on the upper interconnects; and bonding the upper substrate and the lower substrate such that the upper pads are provided on the lower pads and are in contact with the lower pads, wherein the lower pads are formed to include a plurality of first pads and a plurality of second pads, and the upper pads are formed to include a plurality of third pads provided on the second pads and a plurality of fourth pads provided on the first pads after the bonding, a lower face of each third pad after the bonding being larger in area than an upper face of each second pad, a lower face of each fourth pad after the bonding being smaller in area than an upper face of each first pad.

15. The method of claim 14, wherein the lower pads are formed by forming lower openings in a lower insulator on the lower interconnects, embedding a material of the lower pads in the lower openings, and planarizing a surface of the material in the lower openings, and the upper pads are formed by forming upper openings in an upper insulator on the upper interconnects, embedding a material of the upper pads in the upper openings, and planarizing a surface of the material in the upper openings.

16. The method of claim 14, wherein the lower pads are formed to be in contact with the lower interconnects, and/or the upper pads are formed to be in contact with the upper interconnects.

17. The method of claim 14, wherein the upper face of each second pad after the bonding is smaller in area than the upper face of each first pad, and the lower face of each fourth pad after the bonding is smaller in area than the lower face of each third pad.

18. The method of claim 14, wherein the lower face of each third pad after the bonding is equal in area to the upper face of each first pad, and the lower face of each fourth pad after the bonding is equal in area to upper face of each second pad.

19. The method of claim 14, wherein the lower pads include the first and second pads alternately arranged on an identical straight line.

20. The method of claim 14, wherein the lower pads include the first pads arranged on first straight lines extending in a predetermined direction, and the second pads arranged on second straight lines extending in the predetermined direction alternately with the first straight lines.

\* \* \* \* \*